United States Patent [19]

Cogan et al.

[11] Patent Number: 5,321,283
[45] Date of Patent: Jun. 14, 1994

[54] HIGH FREQUENCY JFET

[75] Inventors: Adrian I. Cogan, San Jose; Neill R. Thornton, Fremont, both of Calif.

[73] Assignee: MicroWave Technology, Inc., Fremont, Calif.

[21] Appl. No.: 737,950

[22] Filed: Jul. 30, 1991

[51] Int. Cl.[5] ............... H01L 29/80; H01L 23/58; H01L 31/112
[52] U.S. Cl. ................... 257/256; 257/487; 257/490; 257/491; 257/651
[58] Field of Search ............ 357/22 F, 52, 23.12, 357/23.11, 91, 25; 257/489, 651, 487, 491, 490, 494, 256

[56] References Cited

U.S. PATENT DOCUMENTS

| | | | |
|---|---|---|---|
| 4,325,180 | 4/1982 | Curran | 29/571 |
| 4,505,799 | 3/1985 | Baxter | 357/25 |
| 4,700,213 | 10/1987 | Nishizawa et al. | 357/22 F |
| 4,827,324 | 5/1989 | Blanchard | 257/489 |
| 5,005,064 | 4/1991 | Yoshino et al. | 357/52 |
| 5,023,678 | 6/1991 | Kinzer | 357/52 |

Primary Examiner—Rolf Hille
Assistant Examiner—Wael Fahmy
Attorney, Agent, or Firm—Skjerven, Morrill, MacPherson, Franklin & Friel

[57] ABSTRACT

The junction field effect transistors (JFETs) of this invention have improved breakdown voltage capability, reduced on-resistance and improved overdrive capability. The JFET on-resistance is decreased by ion-implanting an insulating layer covering a layer that contains the source and gate regions of the unipolar transistor. The charge of the implanted ions is the same as the charge polarity of the gate regions. To improve the overdrive capability of a JFET a region of conductivity opposite to the conductivity of the gate region is formed in the gate region of the transistor. This region of opposite conductivity creates another junction within the gate region i.e., the junction between the region of opposite conductivity and the gate region, and the junction between the gate region and the layer containing the gate region. The second junction in the gate region of this invention prevents the gate-to-source junction from becoming forward biased until higher gate voltages are applied and thereby provides increased overdrive capability in comparison to prior art JFETs. A new method is used to form a guard ring surrounding the active area of a JFET. The JFET formed using this method has a guard ring of a second conductivity type extending a first distance D1 into a layer having a first conductivity type and a gate region of the second conductivity type extending a second distance D2 into the layer. The method of this invention allows selection of the first and second distances D1, D2 to optimize the breakdown voltage and performance of the JFET of this invention.

65 Claims, 19 Drawing Sheets

HIGH FREQUENCY JFET

BACKGROUND OF THE INVENTION

1. Field of the Invention

This invention relates generally to junction field effect transistors (JFETs) and in particular to a new process for forming a high power high frequency JFET that has an improved breakdown voltage control, reduced on-resistance, and overdrive capability.

2. Prior Art

One goal common to most microwave semiconductor manufacturers is to continually increase the maximum continuous wave (CW) power available from singularly packaged transistors. Recently, as a response to this demand for high performance power transistors, device designers and application engineers have directed their attention away from bipolar power transistors to field effect transistors (FETs). As a consequence, while bipolar transistors have experienced incremental performance gains, FETs, both in MOS and junction gate configurations, have made large steps forward in electrical performance, reliability levels, and cost competitiveness.

For very high radio frequency (RF)/microwave power generation and amplification, the use of a high power supply voltage is highly desirable. As higher power supply voltages are used, the current decreases and the transistor's specific impedance level increases, which in turn reduces the matching, combining, and power splitting circuitry loss and complexity. The higher impedance level makes wide operating frequency bandwidth achievable without significant trade offs in gain.

The power supply voltage for CW power transistors is limited by the transistor breakdown voltage. One technique used to permit higher power supply voltages to use a short channel JFET. One embodiment of a prior art short channel JFET 100 is illustrated in FIG. 1.

The drain of short channel junction field effect transistor (JFET) 100 is a heavily doped region 101 of conductivity type N++. Drain 101 is overlain by a lightly doped epitaxial layer 102 of conductivity type N−. As is known to those skilled in the art, a portion of region 102 functions as the channel of JFET 100.

Two pockets 103, 104 of conductivity type P+, with their centers separated by a distance "a" (the device pitch), extend into epitaxial region 102. Approximately centered between pockets 103, 104 in epitaxial region 102 is a doped source region 105 of conductivity type N+ or N++. An insulating layer 106 (in FIG. 1, a letter is used after reference numeral 106 to identify the different regions of the insulating layer that are visible in the cross-sectional view) overlies surface 102A and has contact openings over pockets 103, 104 and a contact opening over source 105.

Metal gate electrodes 110, 112 electrically contact pockets 103 and 104 respectively and overlie insulating layer 106 so that portions of electrodes 110 and 112 which are not in electrical contact with pockets 103 and 104 are electrically insulated from region 102. Source electrode 111 electrically contacts source 105 and also overlies insulating layer 106 so that portions of electrodes 111 which are not in electrical contact with source 105 are electrically insulated from region 102. A passivation layer 113 overlies electrodes 110, 111, 112 and insulating layer 106.

Short channel JFET 100 has non-saturated current voltage (I-V) characteristics which are similar to those of a vacuum tube triode. FIG. 2 is a graph of the I-V characteristics for short channel JFET 100. The ordinate of the graph is the drain-to-source current in amps ($I_{DS}[A]$) the abscissa is the drain-to-source voltage in volts ($V_{DS}[V]$). Curves 201, 202, 203, 204, and 205 are for gate-to-source voltages ($V_{GS}[V]$) of 0, −2, −4, −6, and −8 volts respectively.

The drain current of JFET 100 (FIG. 1) is controlled by the (negative) gate potential, as well as the (positive) drain potential. The drain current decreases as the magnitude of the (negative) gate voltage increases. Moreover, the drain current increases with a rise in the drain voltage, a "short channel"-like behavior. Conditions under which semiconductor devices exhibit triode-like I-V characteristics are well-known to those skilled-in-the-art. For example see, G. F. Neumark, E. S. Rittner, "Transition from pentode- to triode-like characteristics in FETs", *SSE*, V10, pp. 299–304, 1967. Other references that define the prior art include: W. Shockley, "Transistorelectronics: imperfections, unipolar and analog transistors", *PIRE*. V40, pp. 1289–1313, November 1952; R. Zuleeg, "Multi-channel FET theory and experiment", *SSE*, V10, pp. 559–576, 1967; J. R. Houser, "Characteristics of JFET devices with small channel-to-width ratios", *SSE*, V10, pp. 577–587, 1967; C. Kim, E. Yang, "Carrier accumulation and space-charge-limited current flow in FETs", *SSE*, V13, pp. 1577–1589, 1970; J. Nishizawa, T. Terasaki, J. Shibata, "FET versus Analog Transistor (Static Induction Transistor)"; A. S. Wang C. J. Dell'Oca, "A compatible bipolar and JFET Process" *IEDM Proc.*, pp. 45–47, December 1976; J. Nishizawa, "Semiconductor technology in Japan", *North Holland*, Publisher, N.Y., 1982; M. G. Kane, R. Frey, "The PSIFET emerges as a new contender", *MSN*, pp. 46–58, September 1984; A. Cogan, R. Blanchard, "Progress toward the ultimate semiconductor switch", *Powertechniques Magazine*, pp. 35–39, September 1986; J. Browne, "Solid State Triodes boost high voltages at broad bandwidths", *Microwaves & RRF*, pp. 211–224, May, 1989; B. J. Baliga, "Bipolar operation of power JFETs", *El.Letters*, V10, No. 2, February 1980.

Short channel JFET 100 is a majority carrier device with high internal electric fields that exhibits a large number of favorable electrical and radio frequency characteristics (TABLE I). Only majority carriers (electrons) flow in the short channel of JFET 100 (FIG. 1). Hence, JFET 100 operates at high frequencies because no minority carrier effects are present to slow its operation.

TABLE I

| Characteristics of Prior Art Short Channel JFET 100. |
|---|
| Blocking voltage > 120 V. |
| Voltage Gain ≧ 25 @ $V_{DS}$ = 40 V, $I_{DS}$ = 1 A. |
| Transconductance ≧ 400 mS at $V_{DS}$ = 50 V, $I_{DS}$ = 1 A. |
| $C_{GD}$ ≦ 0.3 pF/W @ $V_{GD}$ = 50 volts. |
| $C_{GS}$ ≦ 0.4 pF/W @ $V_{DS}$ = 15 volts. |
| $C_{DS}$ ≦ 0.1 pF/W @ $V_{DS}$ = 50 volts. |
| Saturated CW power ≧ 150 W @ 250 MHz. |
| $F_{mag}$ ≧ 4GHz. |
| Power gain ≧ 10db @ 250 MHz. |
| Power (drain) Efficiency ≧ 65% @ 500 MHz |

While prior art short channel JFET 100 provides enhanced performance over equivalent bipolar and MOS transistors, short channel JFET 100 is limited by the on-resistance, power overdrive capability, and process limitations that affect breakdown voltage. Techniques for enhancing each of these characteristics are known, but the techniques are generally not applicable to high frequency high power short channel JFET 100. Specifically, the techniques degrade either or both of the power and frequency capability of JFET 100. Therefore, applications of JFET 100 are limited to those applications were the on-resistance, power overdrive and breakdown voltage limitations are not of concern. Unfortunately, in most high power high frequency applications, all of these factors are of concern.

SUMMARY OF THE INVENTION

According to the principles of this invention, the overdrive capability, the breakdown voltage capability and the on-resistance of a unipolar transistor, e.g., a junction field effect transistor, are improved over the prior art unipolar transistors. In one embodiment the on-resistance is decreased by ion-implanting an insulating layer covering a layer that contains the source and gate regions of the unipolar transistor. The ions used are selected so that after implantation the ions maintain their charge both during and after all the subsequent processing steps. This is an important aspect of the invention because if the implanted ions undergo recombination either during or after the subsequent processing, the improvement in on-resistance is lost.

The charge of the implanted ions is the same as the charge polarity of the gate regions. Thus, if the gate region is of conductivity type N, the ions are selected from the group of negatively charged ions consisting of fluorine, chlorine, bromine, iodine, and astatine, which are commonly referred to as the halogens, i.e, family VIIB of the periodic chart. (Herein, hydrogen is not considered a member of family VIIB). Preferably, the iodine ion is used. Alternatively, if the gate region is of conductivity type P, the ions are selected from the group of positively charged ions consisting of lithium, sodium, potassium, rubidium, cesium and francium, which are commonly referred to as the alkali metals. These ions are in family IA of the periodic chart. Preferably, the cesium ion is used.

A novel unipolar transistor with the lowered on-resistance includes a support of a first conductivity type. A layer of the first conductivity is disposed on the support. The layer includes a first pocket having a second conductivity type, i.e, a gate region, separated from a second pocket having said first conductivity type, i.e., a source region. Both the first and second pockets extend into said layer from a surface of the layer. An ion-implanted insulating layer is disposed on the surface of the layer in the region separating the first pocket from the second pocket. Preferably, the transistor is a vertical transistor.

The ions in the insulating layer attract charge carriers of the opposite polarity to the interface between the layer and the insulating layer. The charge carriers of the opposite polarity decrease the size of the depletion zone near the interface and create a higher density of charge carriers in the channel region of the unipolar transistor. Both of these effects reduce the on-resistance of the transistor.

To improve the overdrive capability of a unipolar transistor, a region of conductivity opposite to the conductivity of the gate region is formed in the gate region of the transistor. This region of opposite conductivity creates another junction within the gate region. Thus, the gate region has two junctions, i.e, the junction between the region of opposite conductivity and the gate region, and the junction between the gate region and the layer containing the gate region.

The second junction within the gate region of this invention prevents the gate-to-source junction from becoming forward biased until higher gate voltages are applied and thereby provides increased overdrive capability in comparison to prior art JFETs. Specifically, the gate of the JFET of this invention has two back-to-back diodes such that one of the diodes is always reverse biased. Consequently, the gate of the JFET has a significantly greater power handling capability.

A transistor with improved overdrive capability includes a support of a first conductivity type. A layer of the first conductivity type is disposed on the support so that the layer has a surface opposite to the support. The layer contains a first pocket having a second conductivity type with (i) an upper surface that is a first predetermined distance from the surface of the layer and (ii) a lower surface that is a second predetermined distance from said surface of the layer. The lower surface forms a first junction between the first pocket and the layer.

The layer also contains a second pocket having the first conductivity type where the second pocket extends from the surface of the layer into the layer the first predetermined distance and contacts the first pocket so that a second junction is formed between the first and second pocket. The two pockets within the layer are the gate region with the two junctions, i.e., the two back-to-back diodes, described above.

A new method is used to form a guard ring surrounding the active area of a JFET, according to the principles of this invention. The JFET formed using this method has a guard ring of a second conductivity type, i.e., a pocket, extending a first distance D1 into a layer having (i) a first conductivity type and (ii) a gate region of the second conductivity type extending a second distance D2 into the layer. The method of this invention allows selection of the first and second distances D1, D2 to optimize the breakdown voltage and performance of the JFET of this invention.

To obtain first and second distances that are different, the guard ring and the gate regions are formed in different processing steps. Thus, the method for improving the breakdown voltage of a vertical transistor having a drain region and an active area that includes a source region includes the steps of (i) implanting a guard ring region that surrounds an active area of the transistor with ions of a first conductivity type in a first processing step; and (ii) implanting a gate region within the active area of the transistor with ions of the first conductivity type in a processing step different from the first implanting step so that the characteristics of the gate region and the characteristics of the guard ring region are determined different processing steps.

Specifically, a preferred embodiment of the method includes:

depositing a masking material over a layer of a first conductivity type;

forming openings in the masking material so that the openings surround an area in which the source and gate regions of the transistor are formed in subsequent processing steps;

implanting ions of a second conductivity type in the layer through the openings to form a guard ring implant region;

forming an insulating layer over the layer;

creating openings in the insulating layer to expose surface areas of the layer that will become said gate regions of the transistor; and implanting ions of a second conductivity type in the layer through the openings whereby the gate region is formed with characteristics different from the characteristics of the guard ring region.

In another method to improve the breakdown voltage of the JFET, ions are implanted in the insulating layer so that the implanted ions surround the ends of the gates regions. The ions have a charge polarity opposite to the charge polarity of the gate region. Thus, if the gate region is of conductivity type P, the ions are selected from the group of negatively charged ions consisting of fluorine, chlorine, bromine, iodine, and astatine, which are commonly referred to as the halogens, i.e, family VIIB of the periodic chart. (Herein, hydrogen is not considered a member of family VIIB). Preferably, the iodine ion is used. Alternatively, if the gate region is of conductivity type N, the ions are selected from the group of positively charged ions consisting of lithium, sodium, potassium, rubidium, cesium and francium, which are commonly referred to as the alkali metals. These ions are in family IA of the periodic chart. Preferably, the cesium ion is used.

The implanted ions repeal charge carriers having the same charge polarity as the ions from the layer-insulating layer interface at the ends of the gate regions. Therefore, the depletion zone is increased in this region and the number of charge carriers in the source-drain channel is decreased. Both of these effects reduce the source-to-drain current for a given voltage which increases the breakdown voltage.

Thus, according to the principles of this invention a transistor having an improved breakdown voltage has a support of a first conductivity type, e.g., a drain region. A layer of the first conductivity type is disposed on the support so that the layer has a surface opposite to the support. A first pocket having a second conductivity type is included within the layer. The pocket has (i) a lower surface a first predetermined distance from the surface of the layer and (ii) a first end and a second end, e.g., the pocket is the gate region of the transistor. A second pocket having the first conductivity type is also included in the layer. The second pocket extends from the surface a second predetermined distance into the layer. The second pocket is the source region. An ion-implanted insulating region surrounds the first and second ends of the first pocket and the ions have a charge polarity opposite to the charge polarity of the first pocket thereby improving the breakdown voltage of the transistor, as described above.

Each of the transistors of this invention have the same basic features sizes. Thus, the different embodiments may be intermixed to obtain a unipolar transistor having specific characteristics. For example, a JFET having a gate region and a guard ring with different depths and an ion-implanted layer where the ions have the same charge polarity as the charge polarity of the gate region may be formed. This JFET has an improved breakdown voltage and a reduced on-resistance in comparison to prior art JFETs.

Alternatively, the different depth guard ring and gate region may be combined with the dual junction gate region to obtain a JFET with improved breakdown voltage and improved overdrive capability. If the insulating layer of this JFET is implanted with ions having the same charge polarity as the charge polarity of the gate region, the JFET also has a reduced on-resistance.

DETAILED DESCRIPTION

Figure 3A:
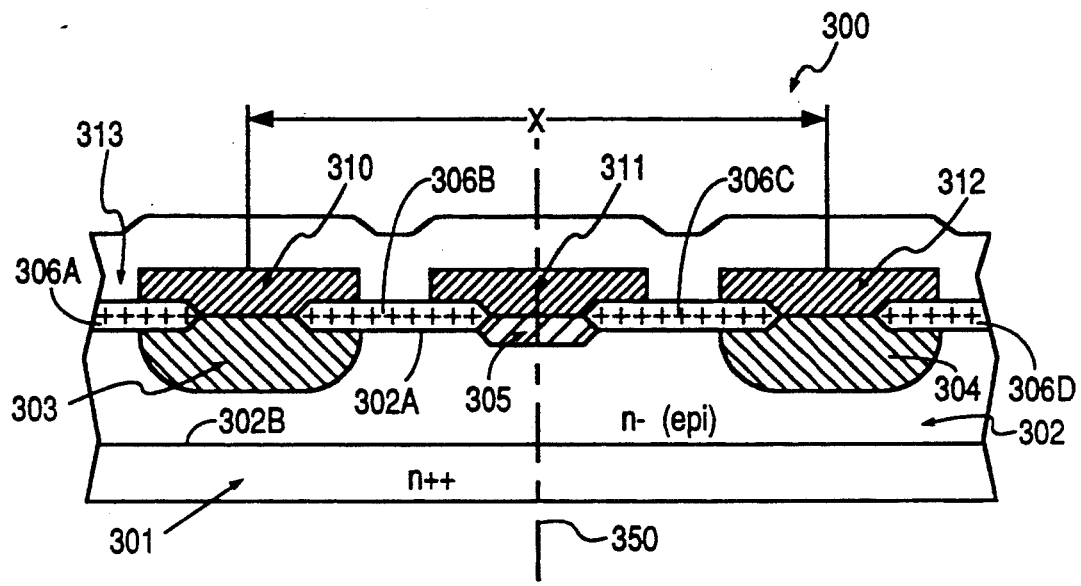
FIGS. 3A and 3B are a cross sectional view of a short channel JFET with a ion-implanted insulating layer that reduces the on-resistance in comparison to the JFET of FIG. 1.

A first embodiment of a novel short channel junction field effect transistor (JFET) 300 with a reduced on-resistance in comparison to JFET 100 is illustrated in FIG. 3A. The drain of JFET 300 is a heavily doped region 301 of a first conductivity type, preferably a silicon substrate of conductivity type N++. Drain 301 is overlain by a lightly doped layer 302 of the first conductivity type, preferably an epitaxial layer of conductivity type N−. A portion of region 302 functions as the channel of JFET 300. In one embodiment, epitaxial layer 302 has a thickness in the range of about 2 micrometers ($\mu$m) to about 20 $\mu$m and is preferably about 10 $\mu$m thick. Herein, "thickness" refers to the distance in a direction perpendicular to the support, e.g., substrate 301, of the JFET.

Two pockets 303, 304 of a second conductivity type, with their centers separated by a distance x (the device pitch), extend from the surface 302A of region 302 into epitaxial region 302A a first predetermined distance. In this embodiment, pockets 303, 304 are conductivity type P+. Surface 302A is the surface opposite surface 302B of epitaxial region 302 that contacts drain 301. As is well known to those skilled in the art, the JFET pitch defines a unit cell that may be replicated to obtain JFETs with varying power handling capability.

Centered between pockets 303, 304 is a pocket 305 of the first conductivity type, e.g., a doped source region, which in this embodiment is conductivity type N+. Source region 305 extends from surface 302A a second predetermined distance into region 302. Preferably, the second predetermined distance is less than the first predetermined distance.

In one embodiment, the first predetermined depth, i.e., the depth of regions 303, 304 in layer 302 is in the range of 0.5 $\mu$m to 10 $\mu$m and preferably about 2.5 $\mu$m. The concentration of dopant atoms in pockets 303 and 304 is about $10^{15}$ to $10^{20}$ atoms/cm$^3$ and preferably about $10^{19}$ atoms/cm$^3$.

The second predetermined depth, i.e., the depth of region 305 in layer 302, is about 0.1 $\mu$m to 1 $\mu$m and preferably about 0.25 $\mu$m. The concentration of dopant atoms in pocket 305 is in the range of about $10^{18}$ to $10^{21}$ atom/cm$^3$ and preferably about $10^{21}$ atoms/cm$^3$. Layer 302 is the range of 4 $\mu$m to 40 $\mu$m thick, preferably about 8 $\mu$m, and has a resistivity in the range of 0.5 $\Omega$-cm to 40 $\Omega$-cm and preferably about 4 $\Omega$-cm.

An ion-implanted insulating layer 306, preferably silicon dioxide implanted with cesium ions, overlies surface 302A and has contact openings over gate pockets 303, 304 and another contact opening over source pocket 305. Ion-implanted insulating layer 306 is implanted with an ion having the same charge polarity as pockets 303, 304, i.e., the same charge polarity as the charge polarity of the conductivity type of the gate regions. Insulating layer 306 has a thickness in the range of 0.1 $\mu$m to 2 $\mu$m, preferably about 0.7 $\mu$m, and has an ion-implant charge dose of $10^{11}$ cm$^{-2}$ to $10^{14}$ cm$^{-2}$ and preferably about $10^{12}$ cm$^{-2}$.

In this embodiment, the positively charged ions are cesium ions. However, the positively charged ions preferably may be any ion selected from the group of ions consisting of lithium, sodium, potassium, rubidium, cesium and francium, which are commonly referred to as the alkali metals.

Alternatively, if the gate regions are of conductivity type P, the insulating layer is implanted with negatively charged ions. The negatively charged ions preferably may be any ion selected from the group of ions consisting of fluorine, chlorine, bromine, iodine, and astatine, which are commonly referred to as the halogens, i.e, family VIIB of the periodic chart. (Herein, hydrogen is not considered a member of family VIIB). Preferably, the iodine ion is used.

The ions used are selected so that after implantation the ions maintain their charge both during and after all the subsequent processing steps. This is an important aspect of the invention because if the implanted ions undergo recombination either during or after the subsequent processing, the improvement in on-resistance is lost.

Gate electrodes 310, 312 electrically contact pockets 303 and 304 respectively and overlie ion-implanted insulating layer 306 so that portions of electrodes 310 and 312 which are not in electrical contact with pockets 303 and 304 are electrically insulated from region 302. Preferably, gate electrodes 310, 311 are one metal selected from the group of metals consisting of aluminum and PtSi/TiW/Al.

Source electrode 311 electrically contacts source region 305 and also overlies ion-implanted insulating layer 306 so that portions of electrodes 311 which are not in electrical contact with source 305 are electrically insulated from region 302. Source electrode 311 is also preferably selected from the group of metals described above. Of course, electrodes 310, 311, 312 may be formed from any conductive material and the source and gate electrodes may be formed of different materials. A passivation layer 313 overlies electrodes 310, 311, 312 and ion-implanted insulating layer 306.

Figure 3B:
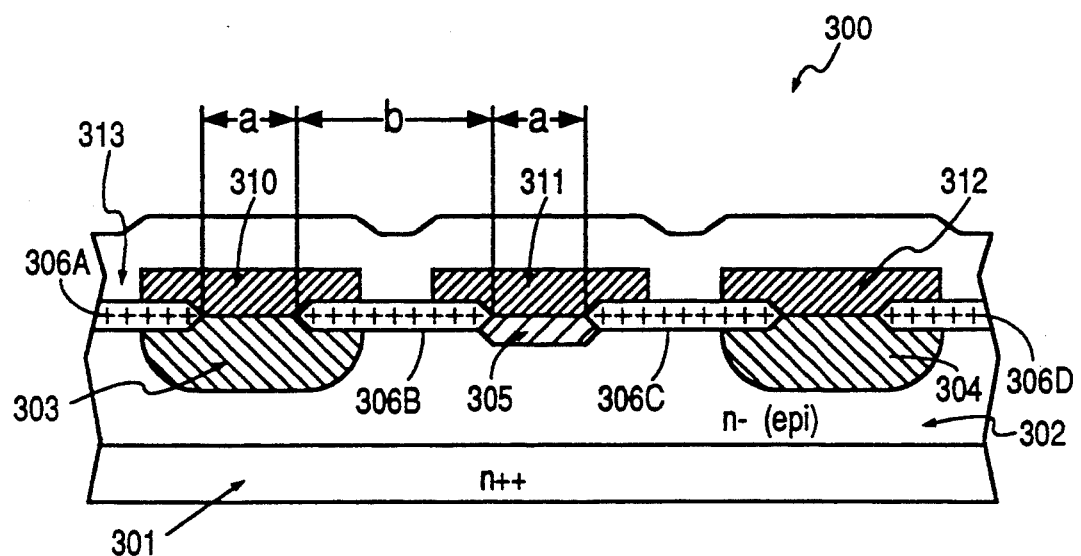

In one embodiment, the width of the opening in layer 306 for the source and drain contacts, i.e., distance "a", (FIG. 3B) is in the range of 0.5 $\mu$m to 5 $\mu$m and preferably about 0.8 $\mu$m. The width of layer 306 between pocket 305 and pockets 303, i.e., distance "b", is about 0.8 $\mu$m to 6 $\mu$m and preferably about 1 $\mu$m. Cell 300 is symmetric about center line 350 of the cell as illustrated in FIG. 3A. Therefore, in this embodiment device pitch x is in the range of 2.6 $\mu$m to 22 $\mu$m and preferably about 3.6 $\mu$m.

Figure 4:
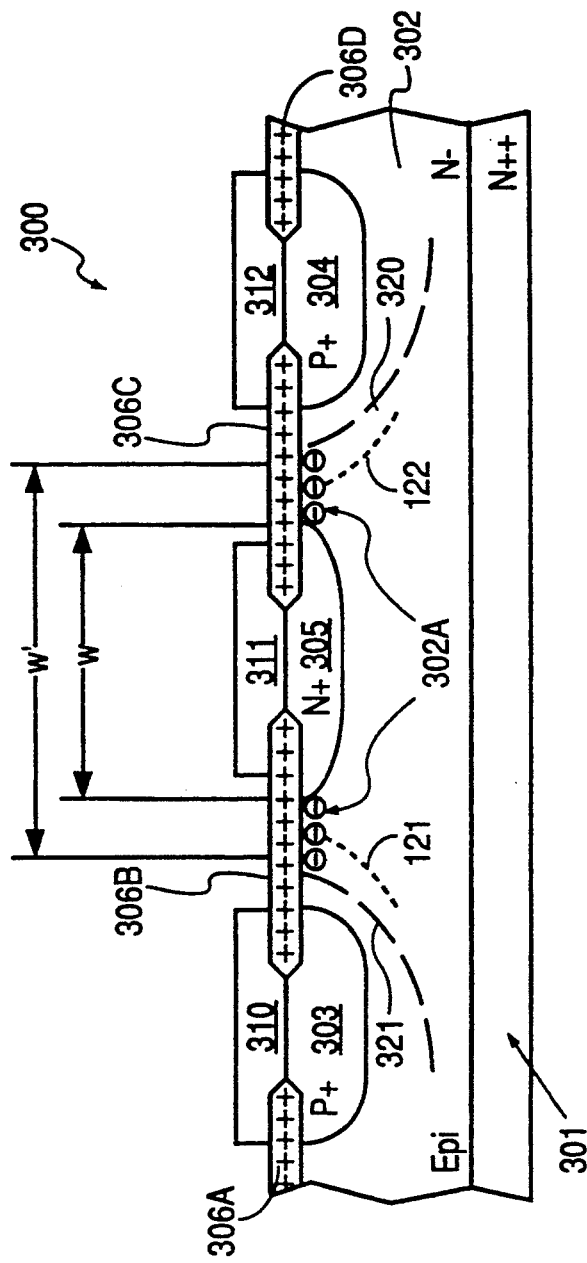
FIG. 4 includes a cross sectional view of a prior art short channel JFET and the short channel JFET of this invention with the improved on-resistance and a comparison of the channel widths of the two JFETs.

The on-resistance of JFET 300 is reduced in comparison to a similar JFET which does not have the ion-implanted insulating layer. Consider prior art transistor 100 (FIG. 1) which has the smallest on-resistance with a gate-to-source bias voltage of 0 volts. With this bias voltage, JFET 100 has depletion regions 121, 122 (See FIG. 4. FIG. 4 is an enlarged view of JFET 300 with the depletion region of JFET 100 shown for comparison). The boundaries of depletion regions 121, 122 for JFET 100 in epitaxial layer 302 are shown by the broken line in FIG. 4. The channel of JFET 100 is the region extending from drain 101 to source 105 between depletion regions 121, 122. As is well-known to those skilled in the art, channel width w of transistor 100 determines the on-resistance of JFET 100.

Prior art techniques to modify channel width w and thereby reduce the on-resistance of JFET 100 included field plates and biasing methods. For example, the on-resistance is reduced by forward biasing the gate-source junction below its turn-on point. However, this requires an additional gate voltage and may accidentally turn-on the junction thereby destroying JFET 100 through excess current.

Field plates may be used to produce an electric field that attracts charge carriers, i.e., electrons, into the depletion region thereby increasing the channel width which in turn reduces the on-resistance. However, such field plates require additional space which in turn increases the JFET gate-to-source distance. As is known to those skilled-in-the-art, as the gate-to-source distance increases, the JFET performance decreases. In particular, the frequency response of the JFET is directly related to the size of the JFET.

The ion-implanted insulating layer of this invention overcomes the shortcomings of the prior art techniques for reducing the on-resistance of JFET 300. Further, the ion-implanted insulating layer, as described more completely below, permits construction of smaller feature, high density devices. With smaller features, the frequency response of JFET 300 improves. Thus, ion-implanting the insulating layer improves both the on-resistance and the frequency response of prior art JFET 100.

Ion-implanted insulating layer 306 (FIG. 4) creates an electric field between source region 305 and layer 306. The electric field causes electrons to be transported from source 305 and to accumulate at silicon dioxide-silicon interface 302A. These excess electrons repopulate the edge of the depletion region thereby effectively reducing the size of depletion regions 320, 321 near interface 302A for a given gate-to-source voltage, i.e, the depletion region is reduced by the permanent positive electrical charge at the silicon dioxide-silicon interface. The decrease in the size of the depletion region results in an increase in width "w'" of the channel region which in turn results in an increase in the current path between source 305 and drain 301. Moreover, the increase in the number of electrons near the channel surface further increases the conductivity of the source-to-drain channel.

As illustrated in FIG. 4, channel width w' of JFET 300 is greater than channel width w of JFET 100. The increased current path improves, i.e., lowers, the on-resistance of JFET 300 over JFET 100. This means that for a given acceptable on-resistance, JFET 300 of this invention requires a smaller channel width than prior art JFET 100. Thus, JFET 300 may be constructed with smaller features which results in the improved density and frequency performance. Further, the lower specific on-resistance (per area) enables better use of the silicon "real estate".

Figure 5A:
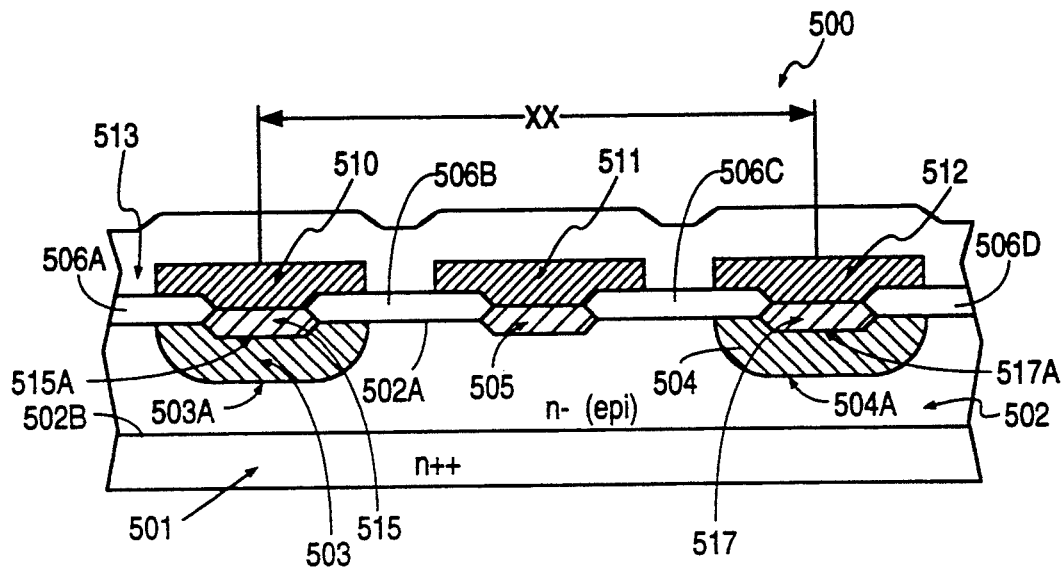
FIG. 5A is a cross sectional view of a short channel JFET with an additional junction in the gate region that provides enhanced overdrive capability in comparison to the JFET of FIG. 1.

A second embodiment of a novel short channel junction field effect transistor 500 with an increased overdrive capability relative to prior art JFET 100 (FIG. 1) is illustrated in FIG. 5A. A heavily doped region 501, preferably a silicon substrate of a first conductivity, e.g., conductivity type N++, functions as the drain of JFET 500. Drain 501 is overlain by a lightly doped layer 502 of the first conductivity type and is preferably an epitaxial layer of conductivity type N−. A portion of region 502 functions as the channel of JFET 500.

Two pockets 503, 504 of a second conductivity type, with their centers separated by a distance xx (the device pitch), extend into epitaxial region 502 a first predetermined distance from the surface 502A of region 502. Surfaces 503A, 504A of pockets 503, 504 at the first predetermined distance form a diode junction with epitaxial region 502. In this embodiment, pockets 503, 504 are conductivity type P+. Surface 502A is the surface opposite surface 502B of epitaxial region 502 that contacts drain 501.

Herein, device pitch xx is the same as device pitch x of JFET 300. Similarly, the feature sizes and other characteristics of JFET 300 are the same as those of JFET 500.

Within each pocket 503, 504 is a region 515, 517 of the first conductivity type N+ that extends into pocket 503, 504 a second predetermined distance from the surface 502A of region 502. Surfaces 515A, 517A of pockets 515, 517 at the second predetermined distance form a diode junction with pockets 503, 504 respectively. Thus, the gate regions of JFET 500 contain back-to-back diodes.

Centered between pockets 503, 504 is a doped source region 505 of the first conductivity type, which in this embodiment is conductivity type N+. In this embodiment, source region 505 extends from surface 502A the second predetermined distance into region 502. Preferably, the second predetermined distance is less than the first predetermined distance. An insulating layer 506, preferably silicon dioxide, overlies surface 502A and has contact openings over pockets 503, 504 and a contact opening over source 505.

Gate electrodes 510, 512 electrically contact pockets 516 and 517 respectively and overlie insulating layer 506 so that portions of electrodes 510 and 512 which are not in electrical contact with pockets 516 and 517 are electrically insulated from region 502. Preferably, gate electrodes 510, 511 are one metal selected from the group of metals described above for transistor 300.

Source electrode 511 electrically contacts source 505 and also overlies insulating layer 506 so that portions of electrodes 511 which are not in electrical contact with source 505 are electrically insulated from region 502. Source electrode 511 is also preferably selected from the group of metals described above. Of course, electrodes 510, 511, 512 may be formed from any conductive material and the source and gate electrodes may be formed of different materials. A passivation layer 513 overlies electrodes 510, 511, 512 and insulating layer 506. The dimensions and doping concentrations of JFET 500 are the same as those of JFET 300 which are incorporated herein by reference.

When prior art JFET 100 (FIG. 1), described above, is used in a high frequency amplifier circuit, the gate-to-source junction may become forward biased when the source input signal increases above a certain threshold or power level, i.e, JFET 100 is overdriven. When the gate-to-source junction becomes forward biased, the junction injects minority carriers into the drain-to-source channel. Consequently, unipolar JFET 100 becomes a bipolar transistor, i.e, the input signal has exceeded the bipolar turn-on threshold and JFET 100 may be destroyed by excess current. Also, a bipolar transistor has a slower response than a unipolar transistor such as JFET 100. To prevent the bipolar mode, the power level of JFET 100 must be maintained, i.e., limited, so that JFET 100 in not driven over the bipolar turn-on threshold.

Figure 5B:
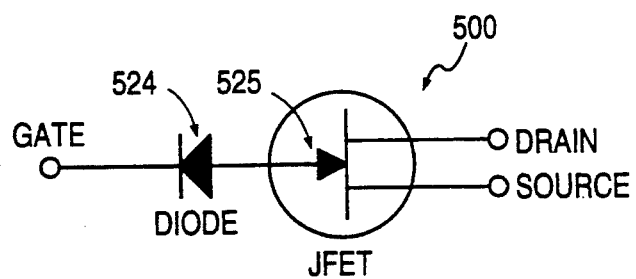
FIG. 5B is an equivalent circuit for the JFET of FIG. 5A.

The second n-p junction 515A, 517A in gate regions 503, 504 of JFET 500 (FIG. 5A) of this invention prevents the gate-to-source junction from becoming forward biased until higher gate voltages are applied and thereby provides increased overdrive capability in comparison to JFET 100. Specifically, an equivalent circuit for unipolar transistor 500 (FIG. 5A) is illustrated in FIG. 5B. The gate of JFET 500 has two back-to-back diodes 524, 525 such that one of the diodes is always reverse biased. Consequently, the gate of JFET 500 has a significantly greater power handling capability.

Figure 5C:
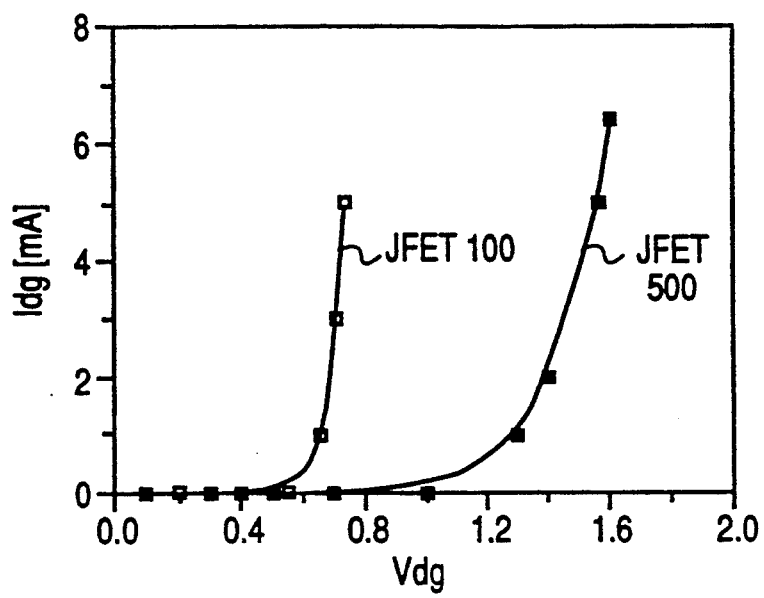
FIG. 5C is a graph of drain-to-gate current vs. drain-to-gate voltage for JFET 100 of FIG. 1 and JFET 500 of this invention.
Figure 5D:
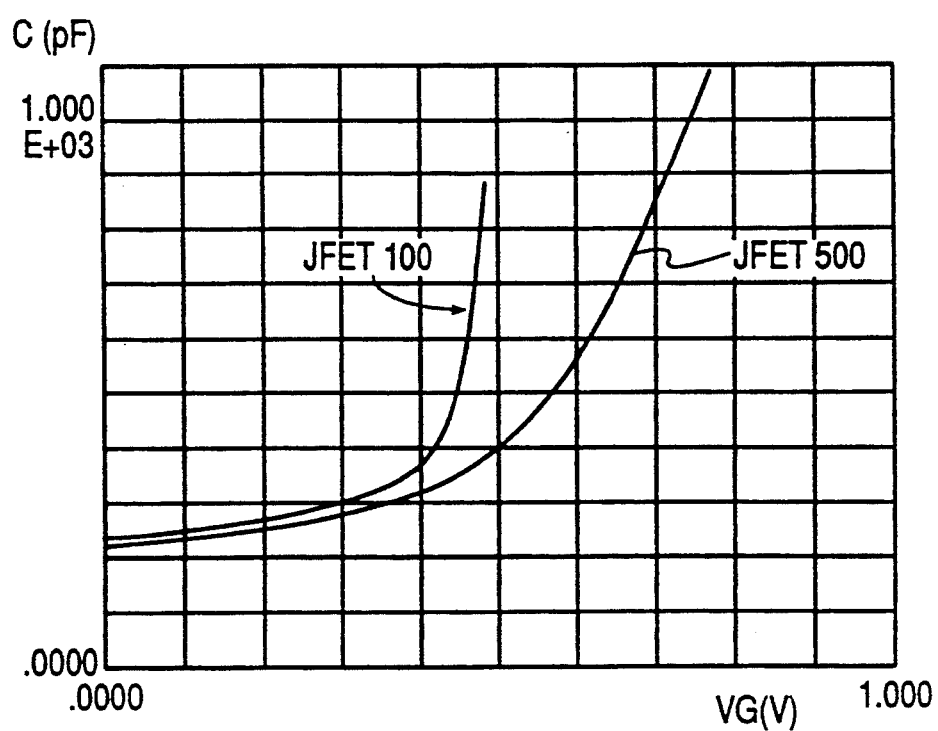
FIG. 5D is a graph of capacitance vs. gate voltage for JFET 100 of FIG. 1 and JFET 500 of this invention.

The bipolar turn-on threshold is increased from about the 0.6 volts of JFET 100 to several volts, typically about 2 to 3 volts, i.e., the breakdown-voltage of diode 524, or even higher as illustrated in FIG. 5C. The increase in the bipolar turn-on voltage also results in an increase of the capacitance "turn-on" voltage as shown in FIG. 5D.

Since the bipolar turn-on voltage of JFET 500 is increased, the maximum acceptable high frequency input power level is also increased. Moreover, the second diode does not affect normal operation of JFET 500 because a JFET has a very high input impedance, typically several megohms. The impedance of the second diode only changes the JFET input impedance by a small amount, e.g., about 10 percent.

Figure 6:
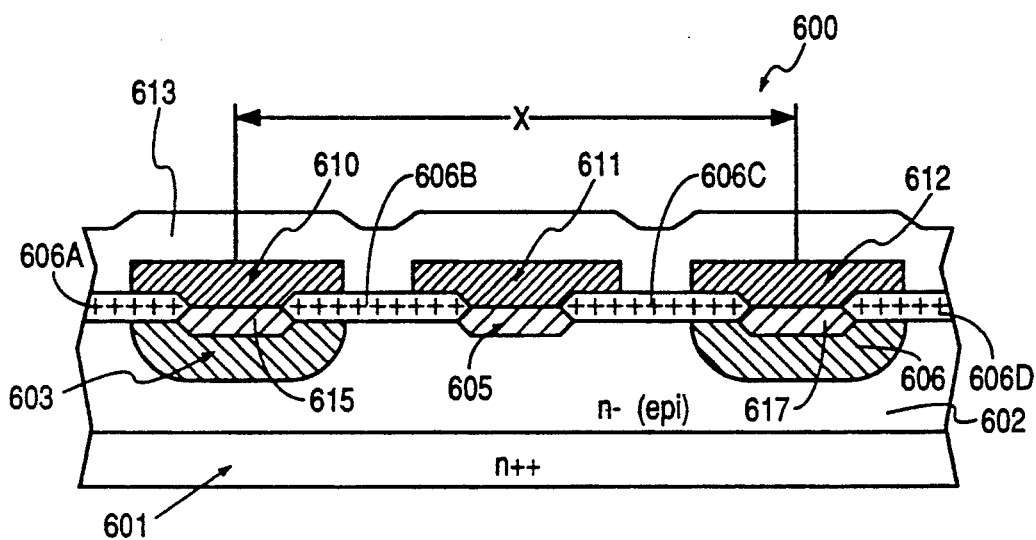
FIG. 6 is a short channel JFET according to the principles of this invention that has improved overdrive capability and a reduced on-resistance in comparison to the JFET of FIG. 1.

In another embodiment, ion-implanted insulating layer 306 of JFET 300 and the additional n-p junctions of JFET 500 are included in a single JFET 600 (FIG. 6). The other features of JFET 600 are similar to those described above for JFETs 300 and 500 and that description is incorporated herein by reference. Thus, JFET 600 has both a reduced on-resistance and an enhanced power overdrive capability in comparison to prior art JFET 100.

Figure 7:
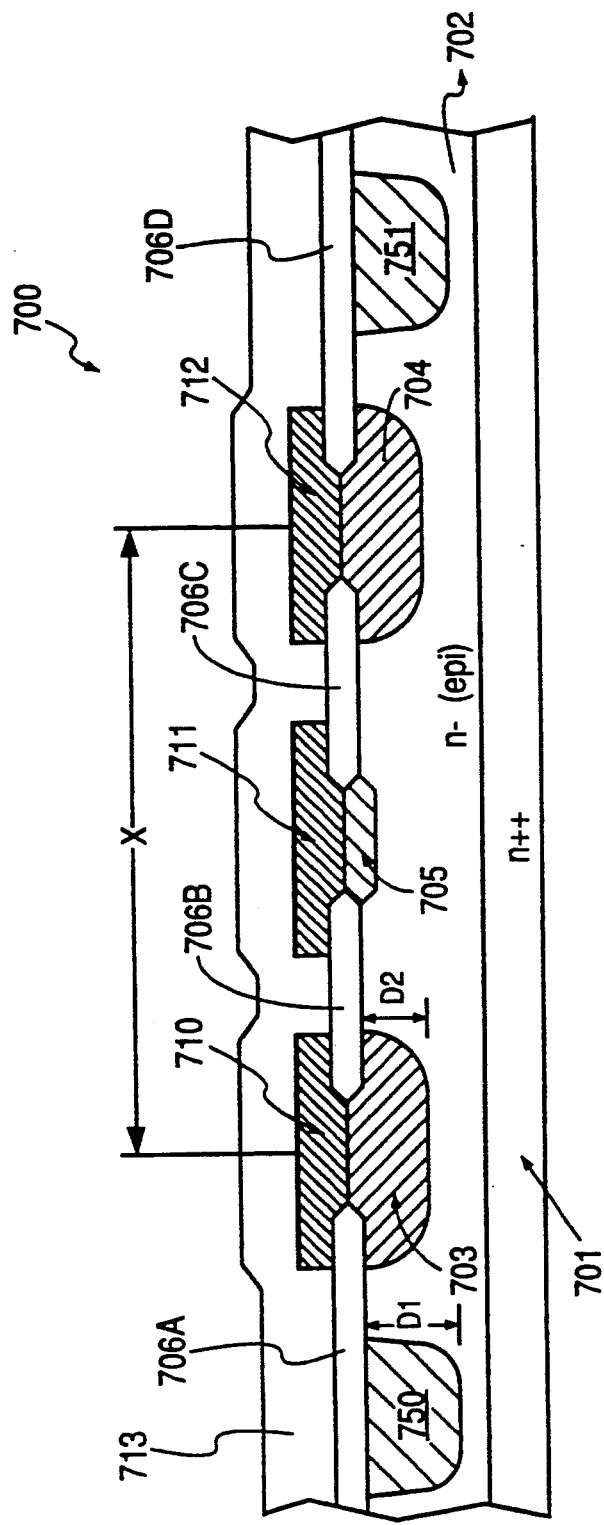
FIG. 7 is a cross sectional view of a short channel JFET according to the principles of this invention that has a guard ring and gate regions that are formed in different processing steps so that the characteristics of the guard ring and the gate regions may be tailored for optimum performance.

In yet a third embodiment of this invention, the breakdown voltage of JFET 100 (FIG. 1) is increased using a novel processing method to form a JFET 700 (FIG. 7) with a guard ring 750, 751 of P conductivity type extending a first distance D1 into epitaxial layer 702 and gate regions 703, 704 of P conductivity type extending a second distance D2 into epitaxial layer 702. First and second distances D1, D2 are selected to optimize the breakdown voltage and performance of JFET 700. As described above, distance D2 is in the range of 0.5 μm to 10 μm, and preferably about 2.5 μm. The distance D1 is in the range of 0.5 μm to 10 μm, and preferably about 3 μm.

Figure 1:
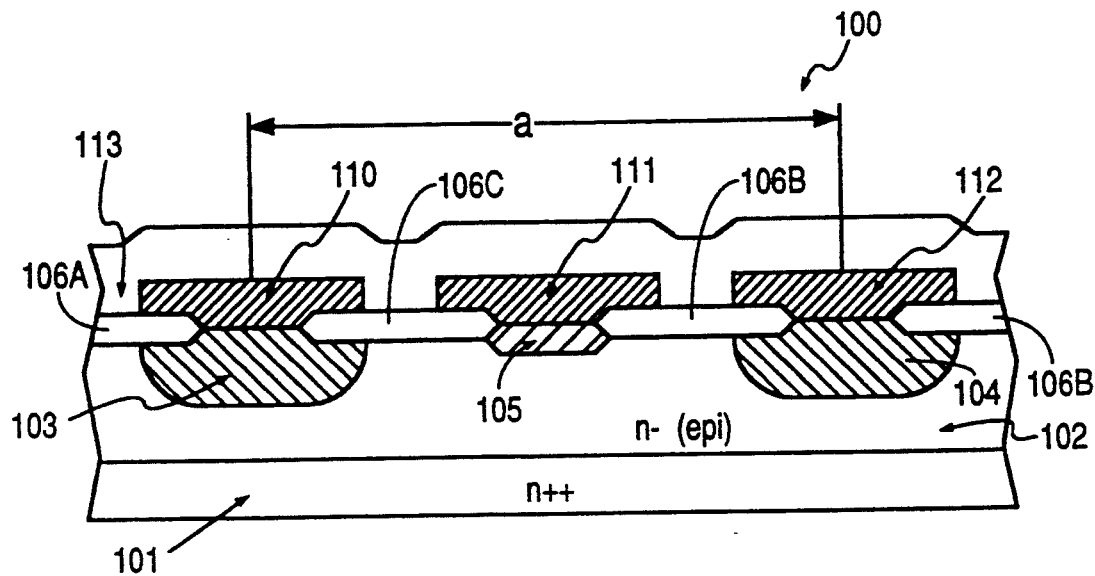
FIG. 1 is a cross sectional view of a prior art short channel JFET.
Figure 8A:
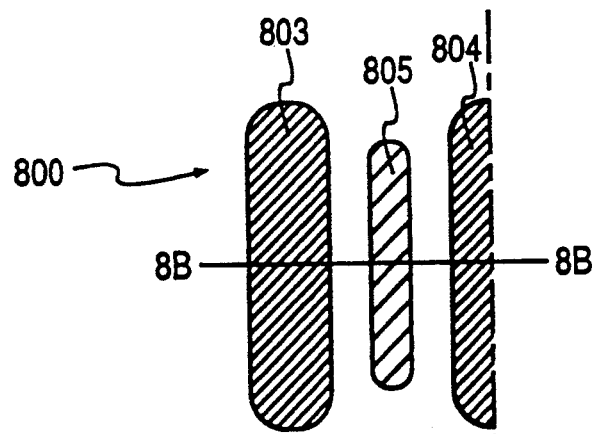
FIGS. 8A and 8B are a top view and a cross-sectional view respectively of a prior art short channel JFET.
Figure 8B:
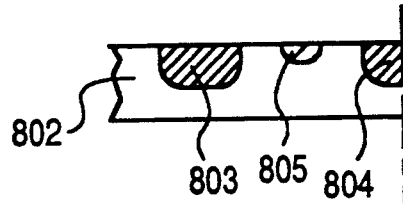

To understand the advantages of this new processing method and resulting JFET 700, it is informative to first consider the prior art methods for forming a diffused guard ring around the active area of JFET 100 (FIG. 1). A top view and a cross-sectional view of a prior art JFET 800 without a guard ring are presented in FIGS. 8A and 8B respectively. Gate regions 803, 804 and source region 805 of JFET 800 are substantially similar to the equivalent regions of JFET 100. JFET 800 is constructed using the basic cell structure of JFET 100. Specifically, JFET 800 has two gate regions 803, 804 of P+ conductivity type and a source region 805 of N+ conductivity type formed in an epitaxial layer 802 of conductivity type N−.

Figure 8C:
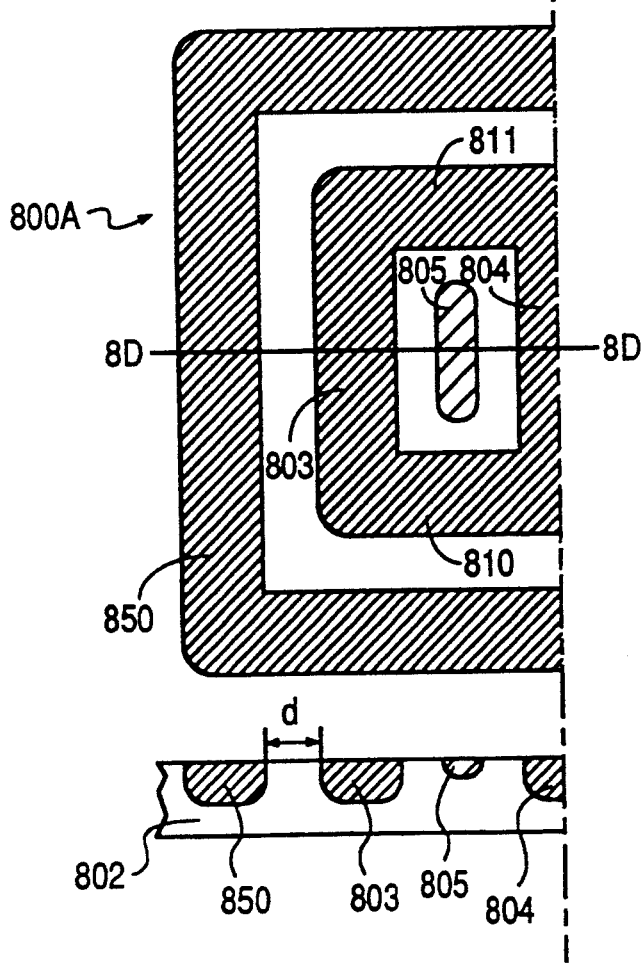
FIGS. 8C and 8D are a top view and a cross sectional view respectively of the prior art JFET of FIGS. 8A and 8B with a guard ring that is used to increase the breakdown voltage overdrive capability.
Figure 8D:
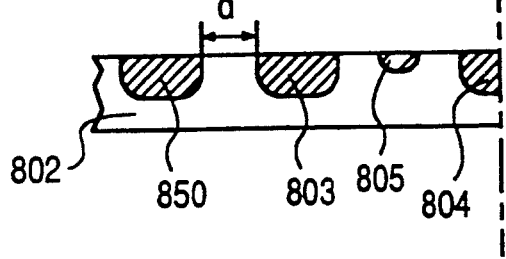

A top view and a cross-sectional view of prior art JFET 800A with a guard ring 850 are illustrated in FIGS. 8C and 8D respectively. Specifically, JFET 800A still has two gate regions 803, 804 of P+ conductivity type and a source region 805 of N+ conductivity type formed in an epitaxial layer 802 of conductivity type N−. However, gate regions 803, 804 are now directly connected by regions 810, 811 of P+ conductivity type. Guard ring 850 is a diffused region of P+ conductivity type that surrounds source region 805 and gate regions 803, 804, 810, 811.

Typically, guard ring 850 (FIG. 8C) is formed in the same process step as gate regions 803, 804 (FIGS. 8C and 8D) so that guard ring 850 and gate regions 803, 804 extend the same distance into epitaxial region 802. Consequently, separate adjustments to the depth of guard ring 850 and gate diffusion regions 803, 804 are not possible. The depth of the guard ring in region 802 and distance "d" determine the breakdown voltage characteristics of the JFET so that the breakdown voltage is limited by the depth of the diffusion required for the gate regions.

Guard ring 850 introduces another problem. The metal contacts to the source region 805 and gate regions 803, 804, 810, 811 of JFET 800A are separate gate and source metalization fingers. If both metal contacts electrically contact guard ring 850, the metal contacts will be shorted.

Figure 9:
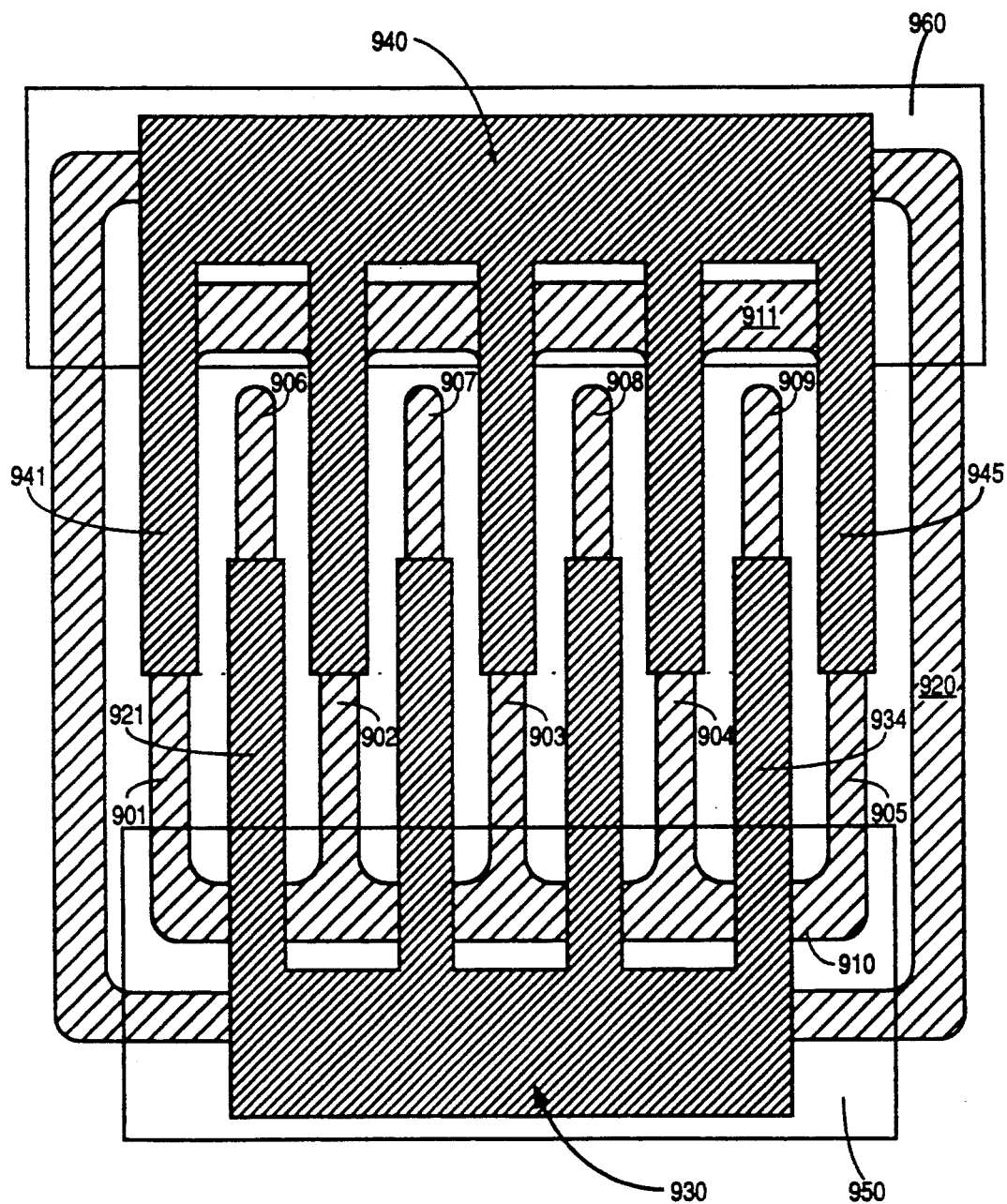
FIG. 9 is view of another prior art short channel JFET that illustrates the guard ring source metalization and gate metalization along with the oxide layers that are required to prevent shorting of the metal layers.

For example, JFET 900 (FIG. 9) has four source regions 906, 907, 908, 909 and five gate regions 901, 902, 903, 904, 905 with interconnecting regions 910, 911. Again, JFET 900 is constructed using unit cell 100 (FIG. 1). Gate metalization fingers 941, 942, 943, 944, 945 of gate contact 940 electrically contact gate regions 901, 902, 903, 904, 905, respectively. Source metalization fingers 931, 932, 933, 934 of source contact 930 electrically contact source regions 906, 907, 908, 909, respectively.

To prevent electrical shorting of gate contact 940 and source contact 930 by guard ring 920, a separate masking step is required in the fabrication process to define insulating layers 950, 960 that insulate the overlying metal contact from the underlying guard ring 920. Typically, a second insulating layer, i.e., a low temperature oxide, is deposited on the structure and patterned prior to the first metalization process step. A masking step is required to pattern the low temperature oxide layer to form regions 950, 960. This masking step increases both production time and production costs of the JFET. Thus, the improvement in breakdown voltage comes at the expense of additional processing steps.

According to the principles of this invention, the breakdown voltage of prior art JFET 100 is enhanced by using separate masking steps to form the guard ring and the gate regions thereby eliminating the separate mask step required in the prior art to form the insulating layer between the guard ring and the source and gate contacts. The elimination of that mask step reduces the production cost of the JFET and in addition, the novel process of this invention provides for adjusting the guard ring diffusion and the gate diffusions for optimum breakdown voltage and performance.

In one embodiment of this invention, the formation of the JFET starts with an N+silicon substrate with a resistivity in the range of 0.001 to 0.01 ohm-cm. In another embodiment, the substrate is processed to form an N++ substrate using standard industry techniques.

After processing of the substrate to form the N++ conductivity region 701, an epitaxial layer 702 of conductivity type N− is grown on the substrate using a conventional chemical vapor deposition process. Epitaxial layer 702 has a thickness in the range of 4 μm to 40 μm preferably about 8 μm, and a resistivity in the range of 0.5 Ω-cm to 40 Ω-cm preferably about 4 Ω-cm.

Subsequent to growing epitaxial layer 702, a silicon dioxide layer 1001 with a thickness of about 0.01 μm to about 0.1 μm, preferably about 0.05 μm, is formed on epitaxial layer 702 using conventional processes known to those skilled in the art.

Figure 10A:
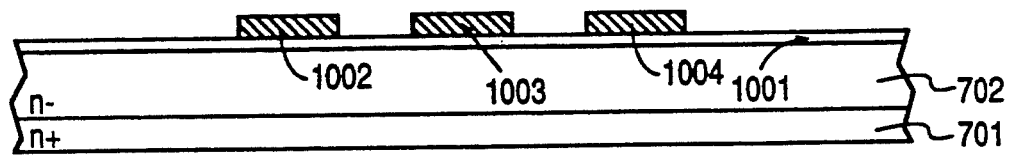
FIGS. 10A–10F illustrate the major processing steps according to the principles of this invention that are used to form the JFET cf FIG. 7.

A mask layer, preferably silicon nitride ($Si_3N_4$), is deposited on silicon dioxide layer 1001 and a photoresist layer is then deposited on the mask layer. The photoresist layer is processed in a standard fashion so that only the portions of silicon nitride mask layer 1002, 1003, 1004 that cover the areas of epitaxial layer 702 that will become the source and gate regions are covered. A standard chemical wet etch is then used to remove the portion of the silicon nitride layer that is not protected by the photoresist. Alternatively, a plasma or RIE etch may also be used. After the etch, the photoresist is removed. Thus, the result of the first mask step is the structure illustrated in FIG. 10A. The distance between the centers of silicon nitride portions 1002, 1004 defines the JFET pitch.

A second mask step is used for the guard ring implantation. A photoresist 1005 is deposited on the structure of FIG. 10A and openings 1007, 1008 for the guard ring implant are formed in a conventional fashion. The width of the guard ring implant opening is the range of 0.5 μm to 5 μm preferably about 1 μm. Edge 1006A1 of masking opening from the guard ring implant is a distance "$d_1$" from edge 1002A of silicon nitride 1002 is in the range of 1 μm to 15 μm and preferably about 6 μm.

In one embodiment, a boron implantation 1006A, 1006B is used in this embodiment to form P+ pockets that will become the guard ring after drive in. The boron implantation uses a flux in the range of $10^{12}$ $cm^{-2}$ to $10^{15}$ $cm^{-2}$ preferably $10^{13}$ $cm^{-2}$ with an energy of 30 Kev to 150 Kev, preferably 60 Kev. After the implantation, photoresist 1005 is removed using standard processes. The implant is driven in using a temperature in the range of 950° C. to 1150° C. for about 0 hours to 3 hours. In one embodiment, a temperature of about 1100° C. for about one hour was used.

In this step, the process parameters affect only the guard ring implant. Recall that in the prior art device, the guard ring and gate implants were formed simultaneously so that the characteristics of the guard ring were primarily determined by the implant required to form the gate region. The gate junction depth affects the device gain, transconductance, and maximum frequency. The process of this invention decouples the gate and guard ring processing steps thereby allowing each step to be tailored for optimal performance.

In the next processing step, a thicker silicon dioxide layer 706 is grown and in the process, the guard ring implant is simultaneously further driven in. This step utilizes conventional processes such as "local oxidation" or "selective oxidation" using the silicon nitride as an oxidation mask. Subsequently, the silicon nitride is removed to form the structure of FIG. 10B. Silicon dioxide layer 706 has a thickness in the range of 0.1 μm to 2 μm and preferably about 0.7 μm.

A third mask step is used for the gate implantation. A photoresist is deposited on the structure of FIG. 10C and all of the photoresist except portion 1015 covering source opening 1011 is removed in a conventional fashion. In one embodiment, a boron implantation 1016A, 1016B is used to form P+ conductivity pockets that form the gate regions. The boron implantation uses a flux in the range of $10^{12}$ $cm^{-2}$ to $10^{15}$ $cm^{-2}$, preferably $2 \times 10^{13}$ $cm^{-2}$ with an energy of 30 Kev to 150 Kev, preferably 60 Kev. After the implantation, photoresist 1015 is removed using standard processes, and the implant is driven in at a temperature in the range of 950° C. to 1150° C., preferably about 1100° C., for a time in the range of 15 minutes to three hours, preferably about 45 minutes.

A fourth mask step is used for the source implantation. A photoresist is deposited on the structure of FIG. 10D without layer 1015 and all of the photoresist except portions 1020, 1021 covering gate openings 1010, 1012, respectively, is removed in a conventional fashion. In one embodiment, an arsenic implantation 1021 is used to form the N+ conductivity pocket that becomes the source region. The arsenic implantation uses a flux in the range of $10^{14}$ $cm^{-2}$ to $10^{16}$ $cm^{-2}$, preferably about $5 \times 10^{15}$ $cm^{-2}$, with an energy of 15 Kev to 100 Kev preferably about 25 Kev. After the implantation, photoresist 1020, 1022 is removed using standard processes and the implant is annealed at a temperature in the range of 500° C. to 1000° C. for 30 seconds to 100 minutes and preferably about 950° C. for about 45 minutes.

In the fifth mask step, metal electrodes 710, 712 to gate region 703, 704 and a metal electrodes 711 to source region 705 are formed using conventional processes. After formation of metal electrodes 710, 711, 712, a silicon dioxide passivation layer is deposited over the structure to obtain JFET 700 using conventional techniques.

In this embodiment and each of the other embodiments of the JFETs of this invention, only a single source region and two gate regions, i.e., a unit cell are included. However, this description is only illustrative of the principles of the invention and is not intended to limit the invention to the particular embodiment described. In view of this disclosure, those skilled in the art can use the novel process to form a JFET with an improved breakdown voltage having multiple source regions and multiple gate regions. Similarly, JFETs with improved on-resistance and overdrive capability can be formed with multiple source regions and multiple gate regions.

Specifically, the JFET of this invention with a guard ring formed by the novel process described above has at 1 GHz approximately the following normalized characteristics per gate width (note that the JFET does not include any ion-implanted insulating regions):

Power ~ 10 watts/cm
On-resistance $R_{on}$ ~ 25 Ωcm
Power gain ~ 10 dB
Breakdown voltage $V_{GD}$ ~ 135 volts
Transconductance ($g_m$) ~ 75 mS/cm
Breakdown voltage $V_{GD}$ ~ 90 volts
without guard ring These parameters can be used to define the size of a JFET with a specific power handling capability.

Using the above process, where the diffused guard ring is formed in the second mask step and the gate is formed in the third mask step, a JFET 700 is obtained with a significantly enhanced breakdown voltage performance in comparison to JFET 100. JFET 700 operates as a depletion mode FET and requires biasing conditions similar to a MESFET, e.g., negative voltage to the gate and positive voltage to the drain. When the source is DC grounded and the drain positively biased, a negative gate voltage is required to turn off JFET 700. JFETs 300, 500 and 600 also operate in this manner.

Figure 2:
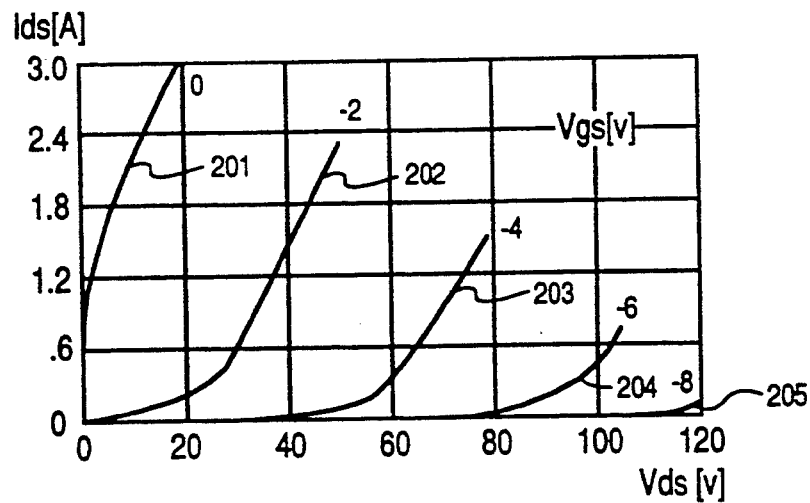
FIG. 2 is a graph of the current-voltage characteristics of the short channel JFET of FIG. 1.
Figure 11:
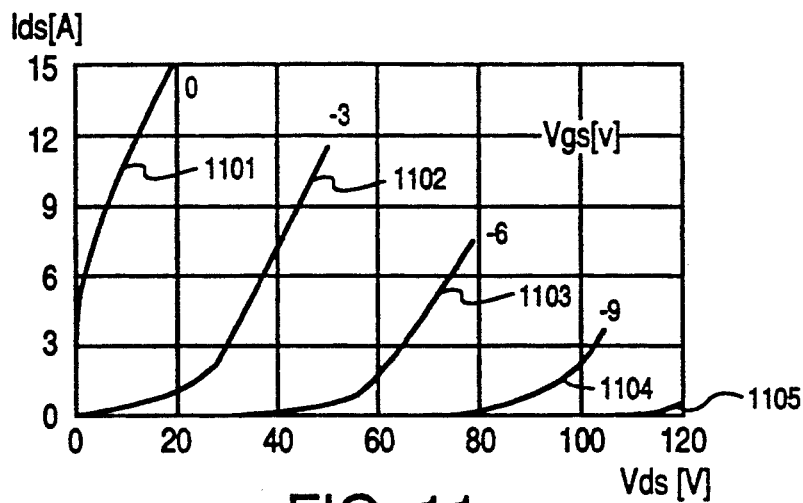
FIG. 11 is a graph of the current-voltage characteristics of the JFET of this invention.

JFET 700 operates over a wide range of drain voltages, and can operate CW at drain supply voltages as high as 80 volts. As illustrated in the I-V curves of FIG. 11, higher gate-to-source voltage and a higher drain-to-source current are achieved with this process than for the I-V curves of FIG. 2. In FIG. 11, the ordinate of the graph is the drain-to-source current in amps ($I_{DS}[A]$) and the abscissa is the drain-to-source voltage in volts ($V_{DS}[V]$). Curves 1101, 1102, 1103, 1104, and 1105 are for gate-to-source voltages ($V_{GS}[V]$) of 0, $-3$, $-6$, $-9$, and $-12$ volts respectively.

Figure 12A:
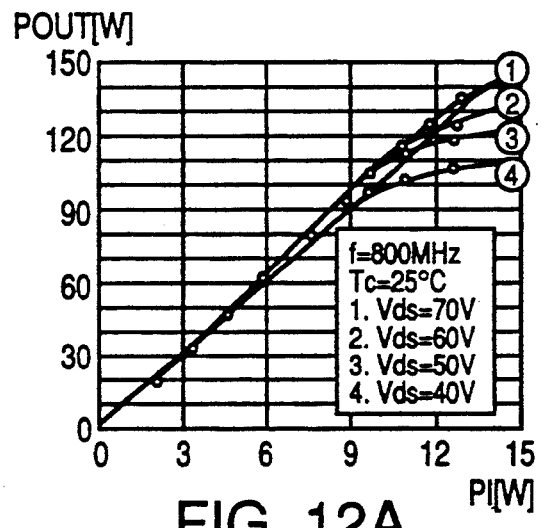
FIG. 12A is a graph of the input power in watts to the output power in watts at 800 MHZ and case temperature of 25° C. for drain-to-source voltages of 40, 50, 60, and 70 volts for the JFET of this invention.

Maximum CW power for single-ended JFETs of this invention is 120 watts(W) or higher at 1000 megahertz(MHz) with a single frequency power gain of 10 decibels(dB) or higher. (Herein, "single-ended" is used to distinguish from "push-pull" operation.) FIG. 12A is a graph of input power in watts PI(W) to output power in watts POUT(W) at 800 MHz and a case temperature of 25° C. for drain-to-source voltages of 40, 50, 60 and 70 volts, respectively of JFET 700.

Figure 12B:
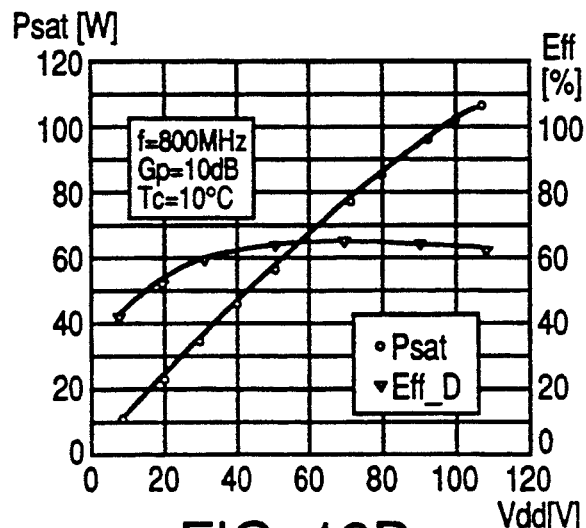
FIG. 12B is a graph of the output power and power efficiency of the JFET of this invention as a functioning of positive drain supply voltage.

The maximum available output power and the power gain of JFET 700 increase when the positive drain supply voltage $V_{DD}$ is increased. Output power and power efficiency as a function of change in positive drain supply voltage $V_{DD}$ are illustrated in FIG. 12B.

In one embodiment, JFET 700 is operated in a common gate configuration to take advantage of the highest frequencies at which JFET 700 still has high power gain. When operated in a common gate configuration, JFET 700 exhibits a single frequency power gain of higher than 10 dB at frequencies as high as 1000 MHz, because JFET 700 has high transconductance of 1 to 2 S coupled with a low common gate feedback capacitance(<0.1 pf/W).

Figure 13:
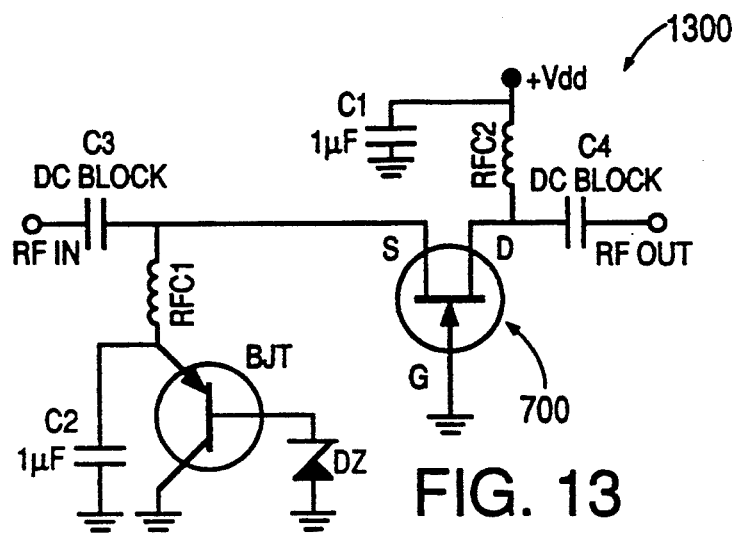
FIGS. 13, 14 and 15 are illustrative examples of bias circuits that may be used with the JFET of this invention in a common gate configuration.
Figure 14:
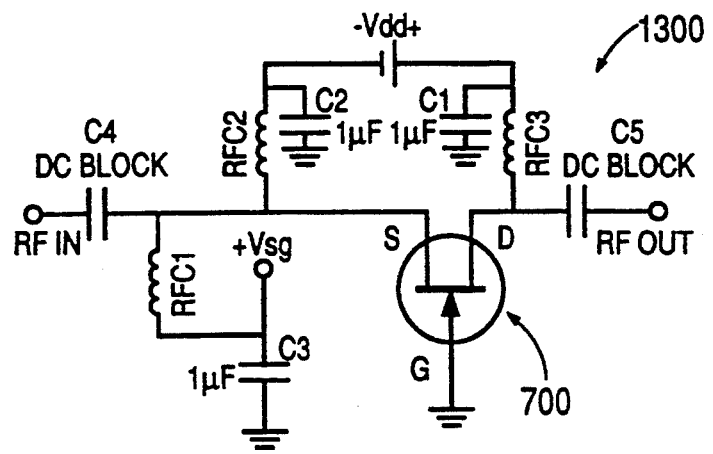
Figure 15:
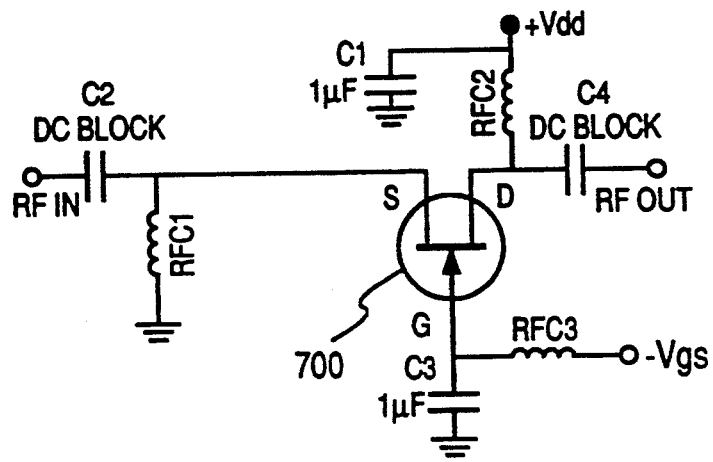

Three basic bias circuits for a DC biased common-gate JFET 700 which permit high RF gain operation are illustrated in FIGS. 13, 14, 15. FIG. 13 has gate G of JFET 700 DC and RF grounded. The gate bias voltage develops across the PNP power bipolar transistor(BJT)/Zener diode (DZ) combination. Bias circuit 1300 (FIG. 13) requires only one power supply. The Zener diode DZ is selected to operate JFET 700 in one of Classes A, AB, B or C. Alternatively, Zener diode DZ may be replaced with a resistive voltage divider connected between positive drain power supply voltage $V_{DD}$ and ground. With the resistive voltage divider, the gate voltage may be continuously adjusted for optimal operation. For automatic gain control applications, a DC voltage component is applied between the base of PNP transistor BJT and ground. In such applications, the linear power gain of JFET 700 is adjustable over a range of about 18 dB.

The bias circuit shown in FIG. 14 separates the DC ground from the RF ground by DC floating the drain power supply $V_{DD}$. A second power supply $V_{SG}$ is required to provide the gate-to-source voltage. This bias circuit eliminates power dissipation in the gate biasing supply, but requires DC floating of the drain power supply.

One family of RF packages widely used in the industry has the input(source) and output(drain) leads positioned between four common leads(gate). The bias circuit shown in FIG. 15 is used with JFET 700 in such a RF package. In this circuit, gate G is RF grounded while source S is DC grounded. The physical implementation of this circuit requires four low-profile planar capacitors to be mounted under the package common leads. Typical values of these capacitors range from 10 pF through 1000 pF.

Figure 16:
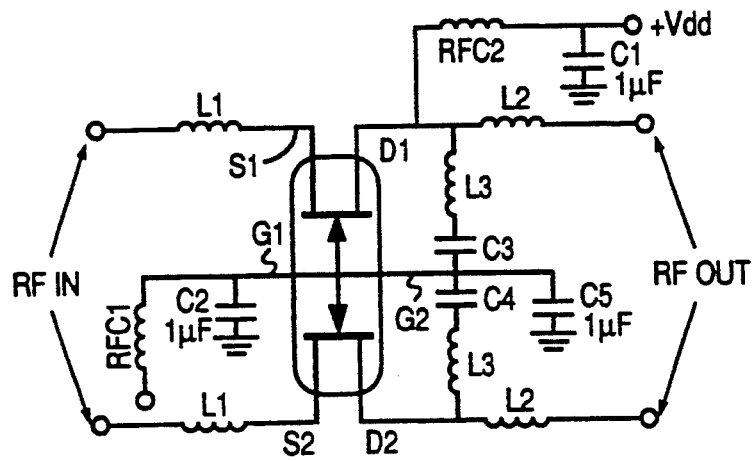
FIG. 16 is a push-pull bias circuit that may be used with another of the JFET of this invention.

In another family of RF packages widely used in the industry has a push-pull eight lead version of JFET 700. This package has two input (source) leads S1, S2, two output (drain) leads D1, D2, and two pairs of common leads (gates) G1, G2. A bias circuit for this embodiment of JFET 700 is illustrated in FIG. 16. This bias circuit provides RF and DC ground separation.

Figure 17A:
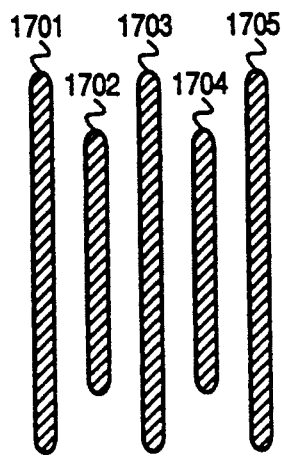
FIGS. 17A–17G illustrate a method for improving the breakdown voltage of prior art JFETs using a ion-implanted insulating layer at the periphery of the gate regions.

In the previous embodiment, a new JFET 700 with a diffused guard ring was used to enhance the breakdown voltage. In another embodiment, the breakdown voltage is enhanced without use of a guard ring. Specifically, ions, having a charge opposite to the conductivity of the gate region, are implanted in the insulating layer, preferably silicon dioxide, at the periphery of the gate implant region. For example, in the structure of FIG. 17A, P+ conductivity type pockets 1701, 1703, 1705 are the gate pockets in an epitaxial layer and N+conductivity type pockets 1702, 1704 are the source pockets in the epitaxial layer. Ends 1701A, 1701B, 1703A, 1703B, 1705A, 1705B of pockets 1701, 1703, 1705 are directly overlain by an insulating layer. In one embodiment this is the insulating layer overlying the surface of the epitaxial layer which has contact openings for the gate and source electrodes.

Figure 17B:
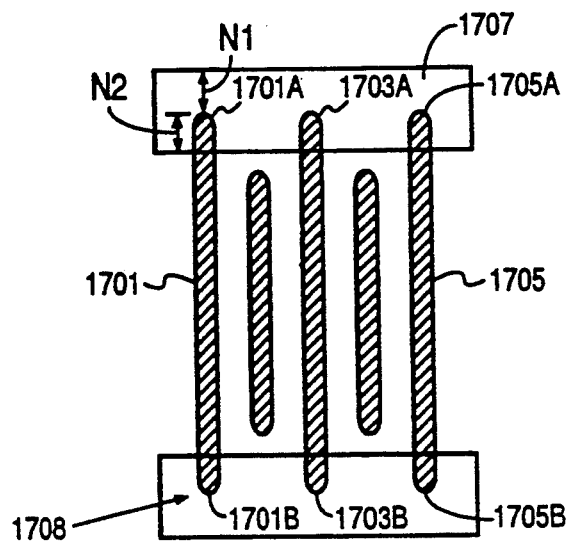

According to the principles of this invention, ions having a charge opposite to charge of the gate pockets, are implanted in regions 1707, 1708 (FIG. 17B). The implanted regions extend a predetermined distance n1 beyond the ends of the gate pockets and a predetermined distance n2 along the gate pocket so that ion-implanted regions 1707 and 1708 surround the ends of the gate pockets.

Both distances n1 and n2 are in the range of 2 $\mu$m to 10 $\mu$m and preferably about 5 $\mu$m. When the gate pocket is of a P+ conductivity type, negatively charged ion are implanted. In one embodiment, the ions are an iodine ion-implantation that uses a flux in the range of $10^{10}$ cm$^{-2}$ to $10^{14}$ cm$^{-2}$, preferably $10^{12}$ cm$^{-2}$, with an energy of 10 Kev to 100 Kev, preferably 20 Kev. While iodine ions are used in this embodiment, the negatively charged ions preferably may be any ion selected from the group of ions consisting of fluorine, chlorine, bromine, iodine, and astatine, which are commonly referred to as the halogens, i.e., family VIIB of the periodic chart. (Herein, hydrogen is not considered a member of family VIIB).

If a N+ conductivity type is used for the gate pockets, the implanted ions are positively charged. The positively charged ions preferably may be any ion selected from the group of ions consisting of lithium, sodium, potassium, rubidium, cesium and francium, which are commonly referred to as the alkali metals. These ions are in family IA of the periodic chart.

Figure 17C:
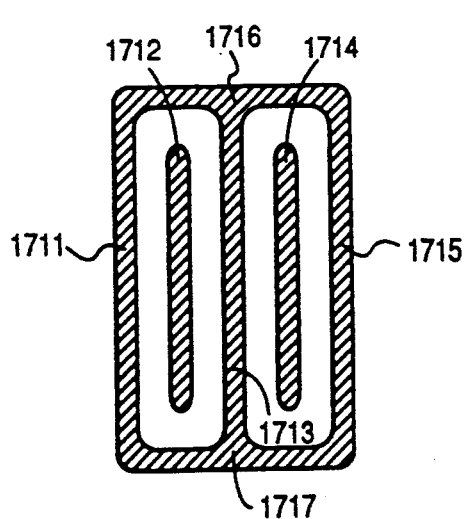
Figure 17D:
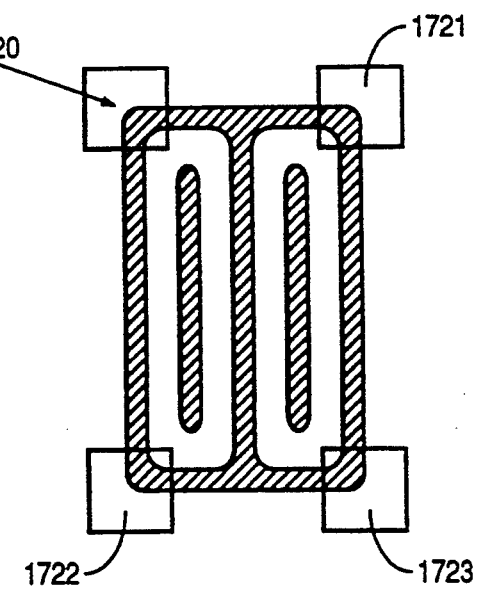

In the structure of FIG. 17C, P+ conductivity type pockets 1711, 1713, 1715 are the gate pockets in an epitaxial layer and are joined by P+ conductivity type pockets 1716, 1717. N+ conductivity type pockets 1712, 1714 are the source pockets in the epitaxial layer. The ends of pockets 1711, 1713, 1715 are directly overlain by an insulating layer. Again, this insulating layer is, in one embodiment, the silicon dioxide layer overlying the epitaxial layer.

According to the principles of this invention, ions having a charge opposite to charge of the gate pockets, are implanted in regions 1720, 1721, 1722, 1723 (FIG.

17D), which are approximately square regions at each corner periphery of the gate region. The size of the region is selected so that the region overlaps the gate regions ends by approximately 2 μm to 10 μm, and preferably about 5 μm.

Figure 17E:
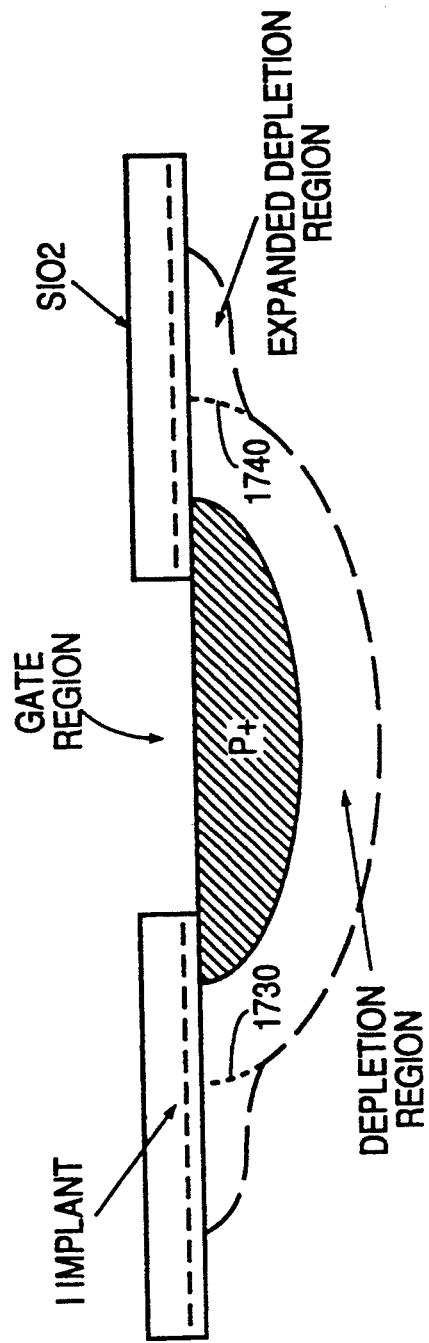

The important aspect of the ion-implant is to place the ions so that the electric field between the source and drain is diminished by the increased depletion area created by the implanted charge. More specifically, FIG. 17E is a cross sectional view of the gate implant region of the JFET of this invention. The conventional depletion region near the silicon-silicon dioxide interface, i.e., the region when the negative ions are not implanted in the insulating layer, is shown by the broken line 1730, 1740. The horizontal extent of the depletion area is significantly enlarged by the implanted negative ions.

The implanted negative ions repel electrons from silicon-silicon dioxide interface 1720 so that there are fewer electrons in the vicinity of the interface to recombine with the minority charge carriers in the gate region. Therefore, electrons are removed from further into the epitaxial layer thereby increasing the size of the depletion region. The larger depletion region reduces the electric field in the channel region which in turn increases the breakdown voltage.

Figure 17F:
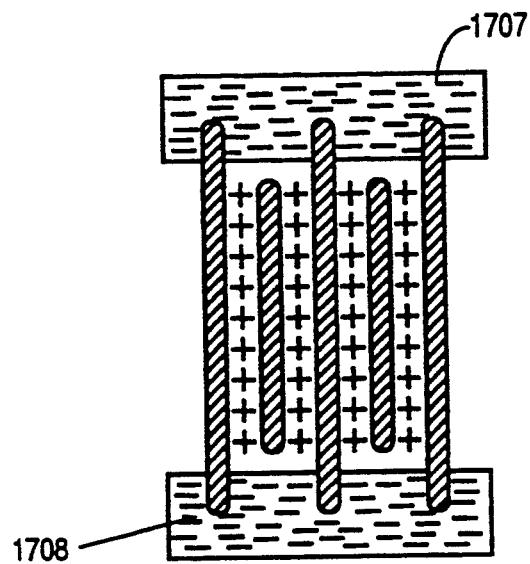
Figure 17G:
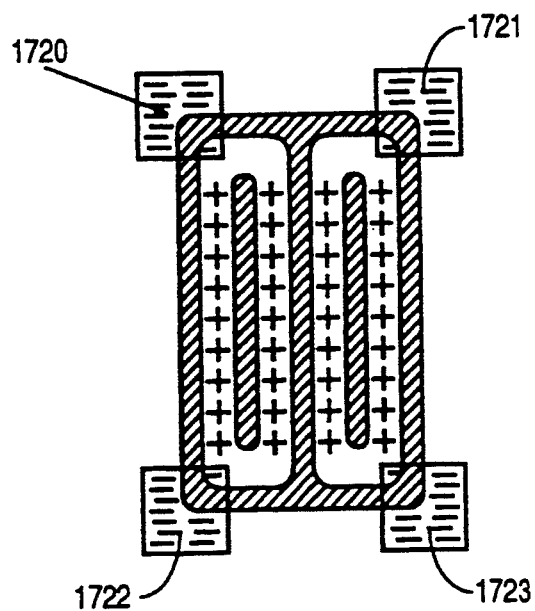

In one embodiment, the implanted negative ions for improved breakdown voltage are used in combination with the positive ions for greater overdrive capability. As described above, the positive ions are implanted in the region bounded by the negative ion-implants at the ends of the gate regions, and the gate and source regions. Specifically, as illustrated in FIGS. 17E and 17F, ion-implanted insulating layer regions 1707, 1708, (FIG. 17E), 1720, 1721, 1722, 1723 (FIG. 17F) contain negatively charged ions, as indicated by the "—" symbol. The ion-implanted insulating layer regions that contain the positively charged ions are indicated by the "+" symbol.

Figure 18:
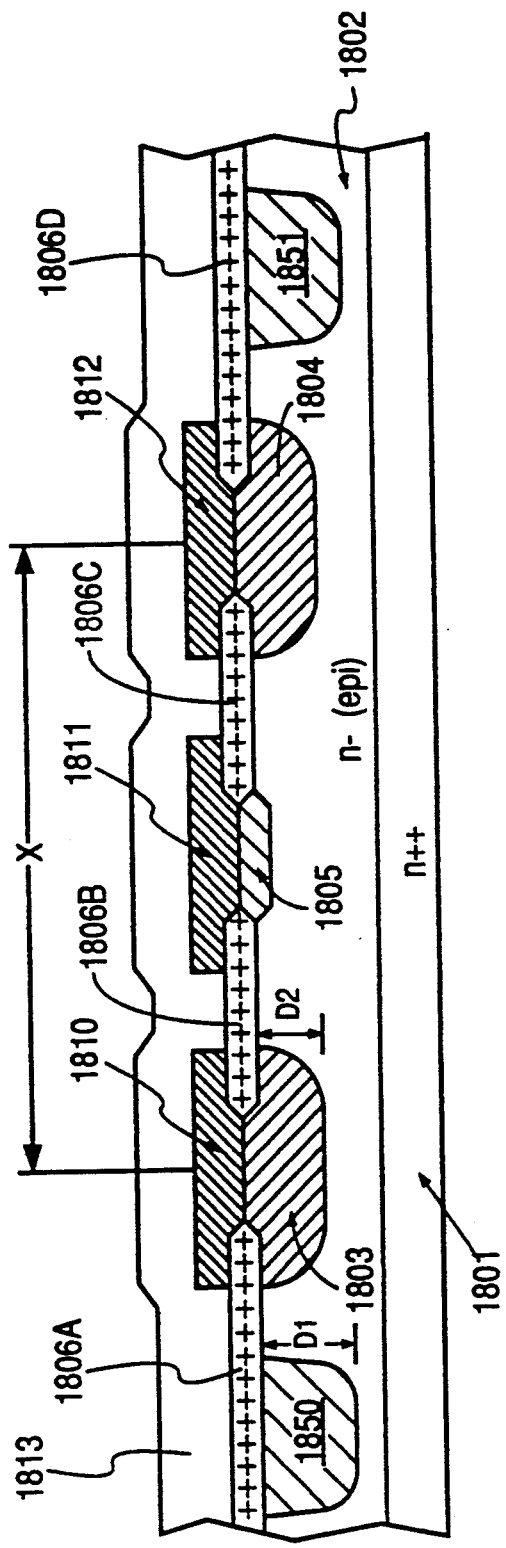
FIG. 18 is a cross sectional view of one embodiment of a JFET of this invention having a reduced on-resistance and an improved breakdown voltage in comparison to the JFET of FIG. 1.
Figure 19:
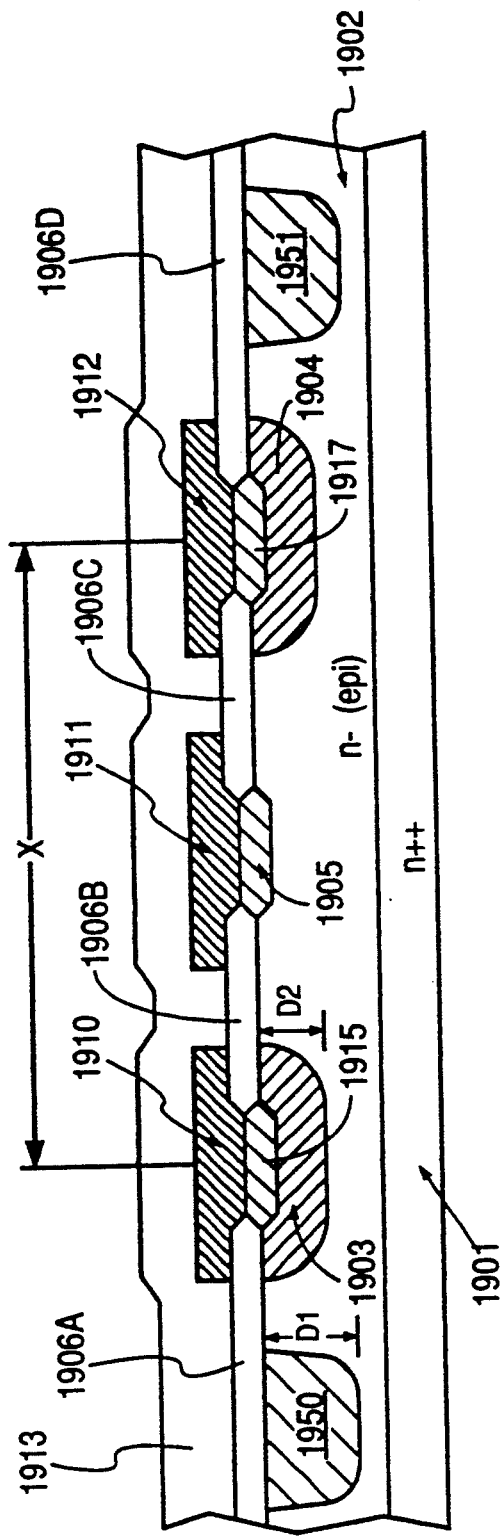
FIG. 19 is a cross sectional view of another embodiment of the JFET of this invention that has enhanced overdrive capability and breakdown voltage performance in comparison with the JFET of FIG. 1.

In another embodiment, JFET 1800 is formed with improved on-resistance and breakdown voltage using a process similar to that described above for JFET 700. Specifically, the process is identical to that described above with respect to FIGS. 10A to 10D and that description is incorporated herein by reference. However, with the structure illustrated in FIG. 10D, positively charged ions are implanted in silicon dioxide layer 706A, 706B, 706C, 706D to form ion-implanted silicon dioxide layer 1806A, 1806B, 1806C, 1806D (FIG. 18) during the third mask step prior to the removal of photoresist 1015 over source opening 1011 After the implant, the implanted layer is annealed at a temperature in the range of 300° to 800° C. for 5 to 600 seconds. In one embodiment, the layer was annealed at a temperature of about 600° C. for about 5 minutes.

In one embodiment, the positively charged ions are cesium ions. However, the positively charged ions preferably may be any ion selected from the group of ions consisting of lithium, sodium, potassium, rubidium, cesium and francium, which are commonly referred to as the alkali metals. The cesium implantation uses a flux in the range of $10^{10}$ cm$^{-2}$ to $10^{14}$ c$^{-2}$, preferably $10^{12}$ cm$^{-2}$, with an energy of 10 Kev to 100 Kev, preferably 20 Kev. Notice that in this embodiment, the positively charged ion-implantation does not require a separate masking step and that the implant is self-aligned with source mask 1015.

Figure 10B:
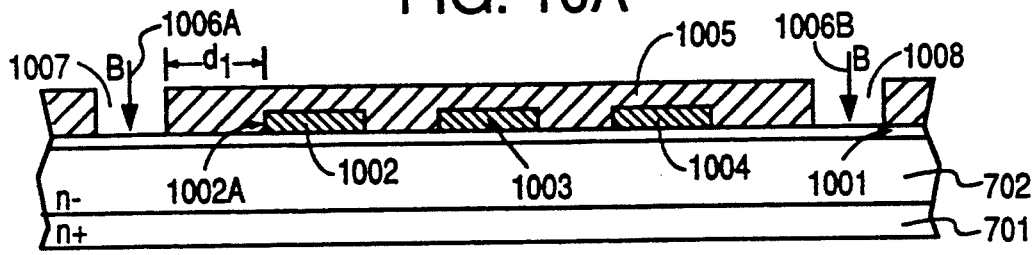
Figure 10C:
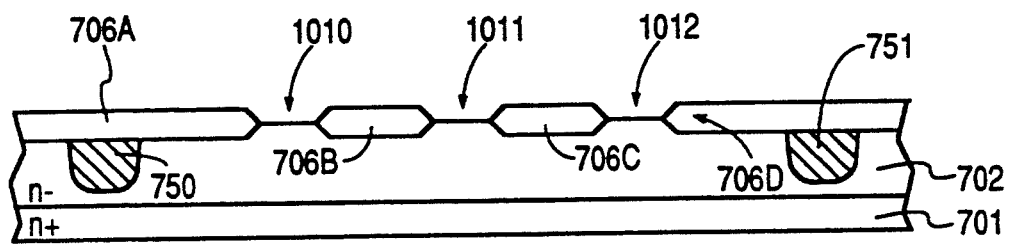

After the cesium implantation, the processing proceeds as described above for FIGS. 10E and 10F and that description is incorporated herein by reference. Of course, if diffused guard ring 1850, 1851 is not desired, the steps associated with FIG. 10B are eliminated from the process and JFET 300 (FIG. 3) is formed.

After implantation, the cesium ions maintain their charge both during and after all the subsequent processing steps. This is an important aspect of the invention because if the implanted ions undergo recombination either during or after the subsequent processing, the improvement in on-resistance provided by the ions will be lost.

If JFET 1800 is formed using P type silicon, negatively charged ions are used to implant the silicon dioxide. The negatively charged ions may be any ion from family VIIB of the periodic chart, commonly referred to as the halogens, as defined above. One embodiment of this invention uses iodine ions.

Figure 10D:
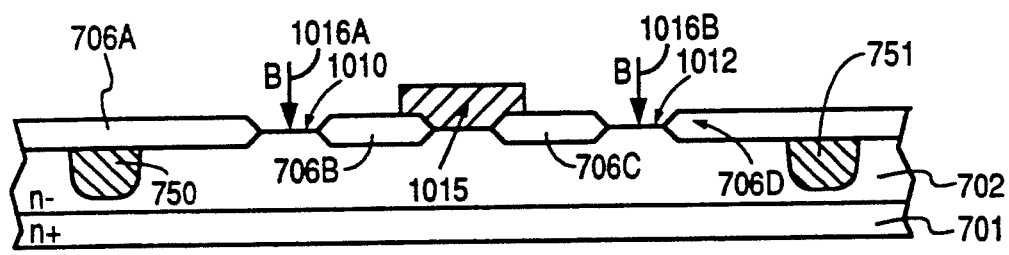
Figure 10E:
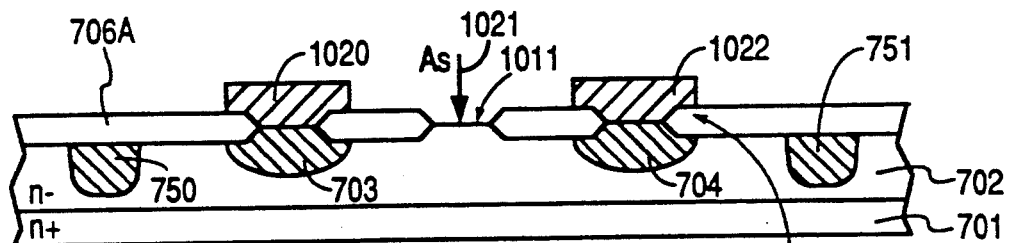
Figure 10F:
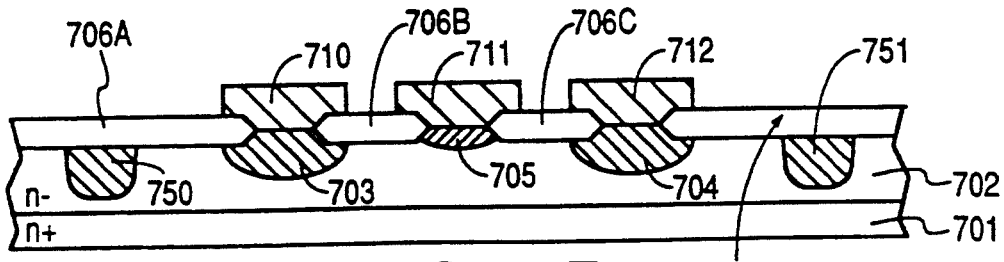
Figure 20:
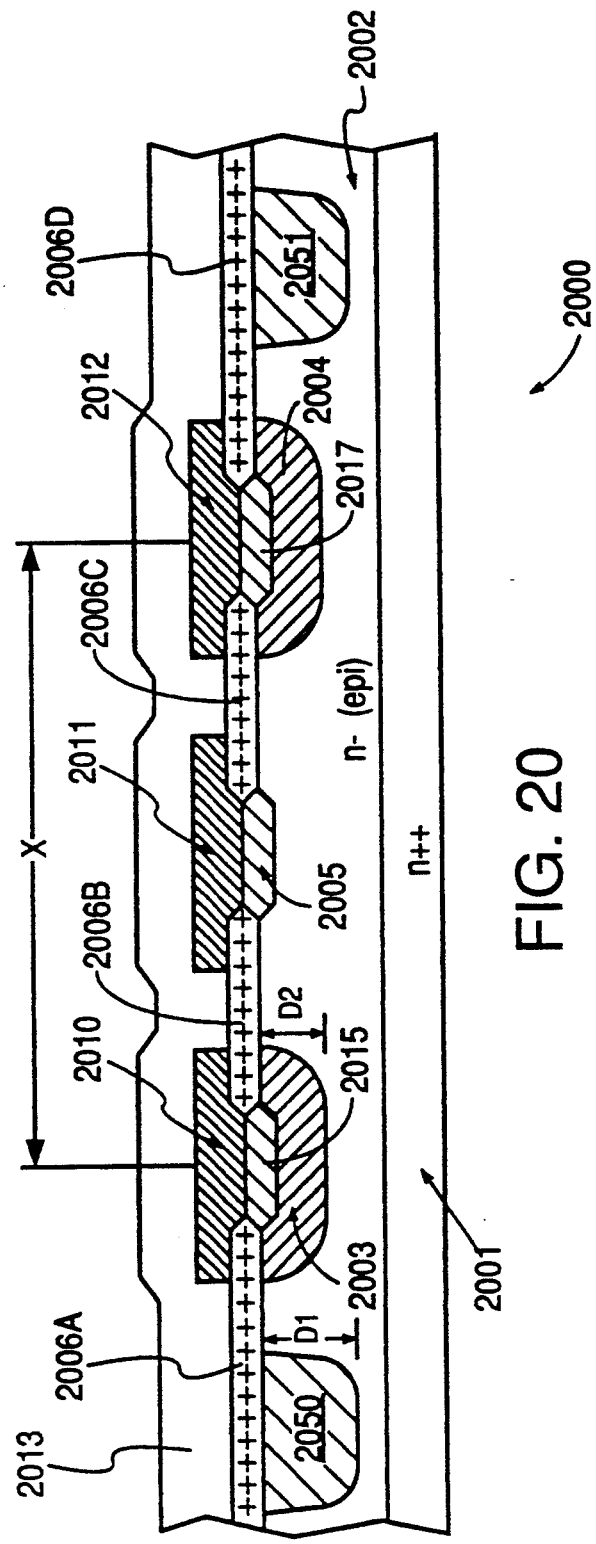
FIG. 20 is yet another cross sectional view of a JFET according to the principles of this invention having an improved breakdown voltage, a reduced on-resistance, and an improved overdrive capability in comparison to the JFET of FIG. 1.

In another embodiment, JFET 1900, with improved overdrive capability and breakdown voltage, is formed using a process similar to that described above for JFET 700. Specifically, the process is identical to that described with respect to FIGS. 10A to 10D and the above description is incorporated herein by reference. However, for this embodiment, photoresist 1020, 1021 are not needed and the arsenic implantation forms source region 1905 and N+ regions 1915, 1917 in gate pockets 1903, 1905 of P+ type conductivity. The processing proceeds as described above for FIG. 10F and that description is incorporated herein by reference. Of course, if diffused guard ring 1850, 1851 is not desired, the steps associated with FIG. 10B are eliminated from the process and JFET 500 (FIG. 5A) is formed. Similarly, if the improved on-resistance is desired in addition to the improved breakdown voltage and overdrive capability, the oxide layer of FIG. 10D is ion-implanted, as described above, during the process used to form JFET 1900 and consequently JFET 2000 (FIG. 20) is formed. In each of the JFETs of this invention the feature sizes and doping concentrations are equivalent for equivalent features. Therefore, all of the processes may be intermixed and interchanged.

Several embodiments of JFETs formed using the principles of this invention have been described above. These embodiments are illustrative only of the principles of the invention and are not intended to limit the invention to the particular embodiments described. In view of this disclosure, those skilled in the art can form a variety of JFETs having any desired combination of the group of features including improved breakdown voltage, improved overdrive capability, and improved on-resistance. In addition, as is well known to those skilled in the art, various conductivity types may be used in the different regions of the JFET to achieve the same functions and results as described herein.

We claim:
1. A unipolar transistor comprising:
   a support of a first conductivity type;
   a layer of said first conductivity disposed on said support and having a surface opposite and removed from said support wherein said layer includes;
   a first pocket having a second conductivity type wherein a first surface of said first pocket is a first predetermined distance from said surface of said layer and a second surface of said pocket is a second predetermined distance from said surface of said layer wherein said first pocket comprises a gate region of said unipolar transistor and further wherein said second predetermined distance is greater than said first predetermined distance; and a second pocket having said first conductivity type and having a surface with a length wherein said second pocket extends from said surface of said layer into said layer said first predetermined distance such that said second pocket surface contacts said first surface of said first pocket along the length of said second pocket surface so that a junction is formed which increases the overdrive capability of said unipolar transistor.

2. The unipolar transistor of claim 1 further comprising a third pocket having said first conductivity type within said layer wherein said third pocket extends into said layer from said surface of said layer and is separated from said first and second pockets.

3. The unipolar transistor of claim 2 further comprising an insulating layer disposed on said layer in the region separating said second and third pockets.

4. The unipolar transistor of claim 3 wherein said layer further includes a fourth pocket having said second conductivity type and further wherein (i) a first surface of said fourth pocket is said first predetermined distance from said surface of said layer and a second surface of said pocket is said second predetermined distance from said surface of said layer and (ii) is separated from said other pockets.

5. The unipolar transistor of claim 4, further comprising a fifth pocket having said first conductivity type and having a surface with a length wherein said fifth pocket (i) extends from said surface of said layer into said layer said first predetermined distance such that said second pocket surface contacts said first surface of said fourth pocket along the length of said second pocket surface so that a junction is formed, and (ii) is separated from said third pocket.

6. The unipolar transistor of claim 5 wherein said insulating layer is disposed on the surface of said layer in the region separating said third pocket from said fifth pocket.

7. The unipolar transistor of claim 6 wherein said insulating layer comprises silicon dioxide.

8. The unipolar transistor of claim 6 wherein said third pocket is centered between said second and fifth pockets.

9. The unipolar transistor of claim 8 further comprising a first electrode wherein said first electrode electrically contacts said second pocket and is electrically insulated from said layer by said insulating layer.

10. The unipolar transistor of claim 9 further comprising a second electrode wherein said second electrode electrically contacts said third pocket and is electrically insulated from said layer by said insulating layer.

11. The unipolar transistor of claim 10 further comprising a third electrode wherein said third electrode electrically contacts said fifth pocket and is electrically insulated from said layer by said insulating layer.

12. A vertical field effect transistor comprising:

a highly doped semiconductor layer of a first conductivity type;

an epitaxial layer of said first conductivity type overlying said highly doped semiconductor layer and having a surface opposite and removed from said highly doped semiconductor layer;

a first pocket having a second conductivity type wherein a first surface of said first pocket is a first predetermined distance from said surface of said epitaxial layer and a second surface of said pocket is a second predetermined distance from said surface of said epitaxial layer wherein said second predetermined distance is greater than said first predetermined distance;

a second pocket having said first conductivity type and having a surface with a length wherein said second pocket extends from said surface of said epitaxial layer into said epitaxial layer said first predetermined distance such that said second pocket surface contacts said first surface of said first pocket along the length of said second pocket surface so that a junction is formed which increases the overdrive capability of said transistor;

a third pocket having said first conductivity type within said epitaxial layer wherein said third pocket extends into said epitaxial layer from said surface of said layer and is separated from said first and second pockets;

a fourth pocket having said second conductivity type wherein (i) a first surface of said fourth pocket is said first predetermined distance from said surface of said epitaxial layer and a second surface of said pocket is said second predetermined distance from said surface of said epitaxial layer and (ii) is separated from said other pockets;

a fifth pocket having said first conductivity type and a surface with a length wherein said fifth pocket (i) extends from said surface of said epitaxial layer into said epitaxial layer said first predetermined distance such that said second pocket surface contacts said first surface of said fourth pocket along the length of said second pocket surface so that a junction is formed and (ii) is separated from said third pocket;

an insulating layer disposed on the surface of said layer in the region separating said second and third pockets and in the region separating said third and fifth pockets;

a first electrode wherein said first electrode electrically contacts said second pocket and is electrically insulated from said epitaxial layer by said insulating layer;

a second electrode wherein said second electrode electrically contacts said third pocket and is electrically insulated from said epitaxial layer by said insulating layer; and a third electrode wherein said third electrode electrically contacts said fifth pocket and is electrically insulated from said epitaxial layer by said insulating layer.

13. The vertical field effect transistor of claim 12 wherein said third pocket is centered between said second and fifth pockets.

14. The vertical field effect transistor of claim 12 wherein said insulating comprises silicon dioxide.

15. A unipolar transistor comprising:

a support of a first conductivity type;

a layer of said first conductivity disposed on said support and having a surface opposite and removed from said support wherein said layer includes:

a first pocket having a second conductivity type wherein a first surface of said first pocket is a first predetermined distance from said surface of said layer and a second surface of said pocket is a second predetermined distance from said surface of said layer and further wherein said second predetermined distance is greater than said first predetermined distance;

a second pocket having said first conductivity type and having a surface with a length wherein said second pocket extends from said surface of said layer into said layer said first predetermined distance such that said second pocket surface contacts said first surface of said first pocket along the length of said second pocket surface so that a junction is formed which increases the overdrive capability of said unipolar transistor;

a third pocket having said first conductivity type wherein said third pocket extends into said layer from said surface of said layer and is separated from said second pocket; and an ion-implanted insulating layer disposed on the surface of said layer in the region separating said second and third pockets;

wherein said ions in said insulating layer have a charge polarity opposite to the charge polarity of said first conductivity type; and said ions maintain their charge during and after processing used to form said vertical field effect transistor so that said ion-implanted insulating layer reduces an on-resistance of said unipolar transistor in comparison to an equivalent unipolar transistor without said ion-implanted insulating layer.

16. The unipolar transistor of claim 15 wherein said layer further includes a fourth pocket having said second conductivity type and further wherein (i) a first surface of said fourth pocket is said first predetermined distance from said surface of said layer and a second surface of said pocket is said second predetermined distance from said surface of said layer and (ii) is separated from said other pockets.

17. The unipolar transistor of claim 16, further comprising a fifth pocket having said first conductivity type and having a surface with a length wherein said fifth pocket (i) extends from said surface of said epitaxial layer into said epitaxial layer said first predetermined distance such that said second pocket surface contacts said first surface of said fourth pocket along the length of said second pocket surface so that a junction is formed, and (ii) is separated from said third pocket.

18. The unipolar transistor of claim 17 wherein said ion-implanted insulating layer is disposed on the surface of said layer in the region separating said third pocket from said fifth pocket.

19. The unipolar transistor of claim 18 wherein said third pocket is centered between said second and fifth pockets.

20. The unipolar transistor of claim 18 further comprising a first electrode wherein said first electrode electrically contacts said second pocket and is electrically insulated from said layer by said ion-implanted insulating layer.

21. The unipolar transistor of claim 20 further comprising a second electrode wherein said second electrode electrically contacts said third pocket and is electrically insulated from said layer by said ion-implanted insulating layer.

22. The unipolar transistor of claim 21 further comprising a third electrode wherein said third electrode electrically contacts said fifth pocket and is electrically insulated from said layer by said ion-implanted insulating layer.

23. The unipolar transistor of claim 15 wherein said ion-implanted insulating layer comprises a silicon dioxide layer.

24. A vertical field effect transistor comprising:

a highly doped semiconductor layer of a first conductivity type;

an epitaxial layer of said first conductivity type overlying said highly doped semiconductor layer and having a surface opposite and removed from said highly doped semiconductor layer;

a first pocket having a second conductivity type wherein a first surface of said first pocket is a first predetermined distance from said surface of said epitaxial layer and a second surface of said pocket is a second predetermined distance from said surface of said epitaxial layer wherein said second predetermined distance is greater than said first predetermined distance;

a second pocket having said first conductivity type and having a surface with a length wherein said second pocket extends from said surface of said epitaxial layer into said epitaxial layer said first predetermined distance such that said second pocket surface contacts said first surface of said first pocket along the length of said second pocket surface so that a junction is formed which increases the overdrive capability of said transistor;

a third pocket having said first conductivity type within said epitaxial layer wherein said third pocket extends into said epitaxial layer from said surface of said layer and is separated from said first and second pockets;

a fourth pocket having second conductivity type wherein (i) a first surface of said fourth pocket is said first predetermined distance from said surface of said epitaxial layer and a second surface of said pocket is said second predetermined distance from said surface of said epitaxial layer and (ii) is separated from said other pockets;

a fifth pocket having said first conductivity type and a surface with a length wherein said fifth pocket (i) extends from said surface of said epitaxial layer into said epitaxial layer said first predetermined distance such that said second pocket surface contacts said first surface of said fourth pocket along the length of said second pocket surface so that a junction is formed and (ii) is separated from said third pocket;

an ion-implanted insulating layer disposed on the surface of said layer in the region separating said second and third pockets and in the region separating said third and fifth pockets;

wherein said ions have a charge polarity opposite to the charge polarity of said first conductivity type; and said ions maintain their charge during and after processing used to form said vertical field effect transistor so that said ion-implanted insulating layer reduces an on-resistance of said unipolar transistor in comparison to an equivalent unipolar transistor without said ion-implanted insulating layer;

a first electrode wherein said first electrode electrically contacts said second pocket and is electrically insulated from said epitaxial layer by said ion-implanted insulating layer;

a second electrode wherein said second electrode electrically contacts said third pocket and is electrically insulated from said epitaxial layer by said ion-implanted insulating layer; and a third electrode wherein said third electrode electrically contacts said fifth pocket and is electrically insulated from said epitaxial layer by said ion-implanted insulating layer.

25. The vertical field effect transistor of claim 24 wherein said third pocket is centered between said second and fifth pockets.

26. The vertical field effect transistor of claim 24 wherein said ion-implanted insulating layer comprises a silicon dioxide layer.

27. A vertical field effect transistor comprising:
a highly doped semiconductor layer of a first conductivity type;
an epitaxial layer of said first conductivity type overlying said highly doped semiconductor layer and having a surface opposite and removed from said highly doped semiconductor layer;
a first pocket having a second conductivity type in said epitaxial layer wherein said first pocket extends from said surface into said epitaxial layer a first predetermined distance;
a second pocket having said first conductivity type in said epitaxial layer wherein said second pocket extends from said surface into said epitaxial layer and is separated from said first pocket wherein said first and second pockets are included in an active area of said field effect transistor;
a third pocket having said second conductivity type wherein said third pocket (i) is separated from and surrounds said active area and (ii) extends from said surface into said epitaxial layer a second predetermined distance wherein said first predetermined distance is less than said second predetermined distance; and
an ion-implanted insulating layer disposed on said surface of said layer;
wherein said ion-implanted insulating layer is disposed on the surface of said layer in the region separating said first pocket from said second pocket and the ions implanted in said insulating layer have a charge polarity opposite to the charge polarity of the first conductivity type; and
said ions maintain their charge during and after processing used to form said vertical field effect transistor so that said ion-implanted insulating layer reduces an on-resistance of said unipolar transistor in comparison to an equivalent unipolar transistor without said ion-implanted insulating layer.

28. The vertical field effect transistor of claim 27 wherein said active area further comprises a fourth pocket having said second conductivity type in said epitaxial layer and further wherein said fourth conductivity pocket (i) extends from said surface into said epitaxial layer said first predetermined distance and (ii) is separated from said second pocket.

29. The vertical field effect transistor of claim 28 wherein said ion-implanted insulating layer is disposed on said the surface of said layer in the region separating said second pocket from said fourth pocket.

30. The vertical field effect transistor claim 29 wherein said ion-implanted insulating layer comprises silicon dioxide.

31. The vertical field effect transistor of claim 26 wherein said second pocket is centered between said first and fourth pockets.

32. The vertical field effect transistor of claim 28 further comprising a first electrode wherein said first electrode electrically contacts said first pocket and is electrically insulated from said layer by said ion-implanted insulating layer.

33. The vertical field effect transistor of claim 32 further comprising a second electrode wherein said second electrode electrically contacts said second pocket and is electrically insulated from said layer by said ion-implanted insulating layer.

34. The vertical field effect transistor of claim 32 further comprising a third electrode wherein said third electrode electrically contacts said fourth pocket and is electrically insulated from said layer by said ion-implanted insulating layer.

35. A vertical field effect transistor comprising:
a highly doped semiconductor layer of a first conductivity type;
an epitaxial layer of said first conductivity type overlying said highly doped semiconductor layer and having a surface opposite and removed from said highly doped semiconductor layer;
a first pocket having a second conductivity type wherein a first surface of said first pocket is a first predetermined distance from said surface of said epitaxial layer and a second surface of said pocket is a second predetermined distance from said surface of said epitaxial layer;
a second pocket having said first conductivity type and having a surface with a length wherein said second pocket extends from said surface of said epitaxial layer into said epitaxial layer said first predetermined distance such that said second pocket surface contacts said first surface of said first pocket along the length of said second pocket surface so that a junction is formed;
a third pocket having said first conductivity type in said epitaxial layer wherein said third pocket extends from said surface and is separated from said second pocket and further wherein said pockets are included in an active area of said transistor;
an ion-implanted insulating layer disposed on the surface of said epitaxial layer in the region separating said second and third pockets;
wherein the ions in said insulating layer have the same charge polarity as the charge of said second conductivity type; and
said ions maintain their charge during and after processing used to form said vertical field effect transistor so that said ion-implanted insulating layer reduces an on-resistance of said unipolar transistor in comparison to an equivalent unipolar transistor without said ion-implanted insulating layer; and
a fourth pocket having said second conductivity type wherein said fourth pocket (i) is separated from and surrounds said active area and (ii) extends from said surface into said epitaxial layer a third predetermined distance wherein said second predetermined distance is less than said third predetermined distance.

36. The vertical field effect transistor of claim 35 wherein said active area further comprises a fifth pocket having said second conductivity type within said epitaxial layer and further wherein (i) a first surface of said fifth pocket is said first predetermined distance from said surface of said epitaxial layer and a second surface of said pocket is said second predetermined distance from said surface of said epitaxial layer and (ii) is separated from said other pockets.

37. The vertical field effect transistor of claim 36 wherein said active area further comprises a sixth pocket having said first conductivity type and having a surface with a length wherein said sixth pocket (i) extends from said surface of said epitaxial layer into said epitaxial layer said first predetermined distance such that said second pocket surface contacts said first surface of said fifth pocket along the length of said second pocket surface so that a junction is formed, and (ii) is separated from said third pocket.

38. The vertical field effect transistor of claim 37 wherein said ion-implanted insulating layer is disposed on said the surface of said epitaxial layer in the region separating said third pocket from said sixth pocket.

39. The vertical field effect transistor claim 38 wherein said ion-implanted insulating layer comprises silicon dioxide.

40. The vertical field effect transistor of claim 34 wherein said third pocket is centered between said second and sixth pockets.

41. The vertical field effect transistor of claim 38 further comprising a first electrode wherein said first electrode electrically contacts said second pocket and is electrically insulated from said epitaxial layer by said ion-implanted insulating layer.

42. The vertical field effect transistor of claim 41 further comprising a second electrode wherein said second electrode electrically contacts said third pocket and is electrically insulated from said epitaxial layer by said ion-implanted insulating layer.

43. The vertical field effect transistor of claim 42 further comprising a third electrode wherein said third electrode electrically contacts said sixth pocket and is electrically insulated from said epitaxial layer by said ion-implanted insulating layer.

44. The vertical field effect transistor of claim 35 wherein said second predetermined distance is in the range of 0.5 $\mu$m to 10 $\mu$m.

45. The vertical field effect transistor of claim 44 wherein said second predetermined distance is about 2.5 $\mu$m.

46. The vertical field effect transistor of claim 35 wherein said third predetermined distance is in the range of 0.5 $\mu$m to 10 $\mu$m.

47. The vertical field effect transistor of claim 46 wherein said third predetermined distance is about 3 $\mu$m.

48. The transistor in any one of claims 1 or 15 wherein said support comprises a highly doped semiconductor layer of said first conductivity type.

49. The transistor in any one of claims 1 or 15 wherein said layer comprises an epitaxial layer.

50. The transistor of claim 49 wherein said epitaxial layer has a thickness in the range of 2 micrometers ($\mu$m) to 20 $\mu$m.

51. The transistor of claim 50 wherein said epitaxial layer has a thickness of about 10 $\mu$m.

52. The transistor in any one of claims 12, 24, or 35 wherein said epitaxial layer has a thickness in the range of 2 micrometers ($\mu$m) to 20 $\mu$m.

53. The transistor of claim 52 wherein said epitaxial layer has a thickness of about 10 $\mu$m.

54. The transistor in any one of claims 7, 14, 23, 26, 30 or 39 wherein said silicon dioxide layer has a thickness in the range of 0.1 $\mu$m to 2 $\mu$m.

55. The transistor of claim 54 wherein said silicon dioxide layer has a thickness of about 0.7 $\mu$m.

56. The transistor in any one of claims 1, 11, 15, 24, 27, or 35 wherein said first conductivity type is N type conductivity.

57. The transistor of claim 56 wherein said second conductivity type is P type conductivity.

58. The transistor in any one of claims 1, 11, 15, 24, 27, or 35 having a pitch in the range of 2.6 $\mu$m to 22 $\mu$m.

59. The transistor of claims 58 having a pitch of about 3.6 $\mu$m.

60. The transistor in any one of claims 15, 24, 27 or 35 wherein said ion-implanted insulating layer is formed a processing step including implanting the insulating layer with an ion-implant charge dose in the range of $10^{11}$ cm$^{-2}$ to $10^{14}$ cm$^{-2}$.

61. The transistor of claim 60 wherein said ion-implant charge dose is about $10^{12}$ cm$^{-2}$.

62. The transistor in any one of claims 1, 7, 15, 24, 27 or 35 wherein the ion-implanted in said ion-implanted insulating layer is selected from the group of ions consisting of fluorine, chlorine, bromine, iodine, and astatine.

63. The transistor of claim 62 wherein the ion-implanted in said insulating layer is iodine.

64. The transistor in any one of claims 15, 24, 27 or 35 wherein the ion-implanted in said ion-implanted insulating layer is selected from the group if ions consisting of lithium, sodium, potassium, rubidium, cesium and francium.

65. The transistor of claim 64 wherein the ion-implanted in said insulating layer is cesium.

* * * * *